(12) United States Patent
Su et al.

(10) Patent No.: US 12,204,250 B2
(45) Date of Patent: *Jan. 21, 2025

(54) TRAINING METHODS FOR MACHINE LEARNING ASSISTED OPTICAL PROXIMITY ERROR

(71) Applicant: ASML NETHERLANDS B.V., Veldhoven (NL)

(72) Inventors: Jing Su, Fremont, CA (US); Yen-Wen Lu, Saratoga, CA (US); Ya Luo, Saratoga, CA (US)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 18/233,365

(22) Filed: Aug. 14, 2023

(65) Prior Publication Data

US 2024/0012335 A1 Jan. 11, 2024

Related U.S. Application Data

(63) Continuation of application No. 18/089,007, filed on Dec. 27, 2022, now Pat. No. 11,768,440, which is a
(Continued)

(51) Int. Cl.
*G03F 7/00* (2006.01)
*G06N 5/047* (2023.01)
*G06N 20/00* (2019.01)

(52) U.S. Cl.
CPC .......... *G03F 7/70441* (2013.01); *G03F 7/705* (2013.01); *G06N 5/047* (2013.01); *G06N 20/00* (2019.01)

(58) Field of Classification Search
CPC ........ G03F 1/36; G03F 7/70441; G03F 7/705; G06F 30/398; G06F 30/392; G06N 20/00;
(Continued)

(56) References Cited

U.S. PATENT DOCUMENTS 5,879,844 A 3/1999 Yamamoto
8,046,722 B2 10/2011 Kotani et al.
(Continued)

FOREIGN PATENT DOCUMENTS

CN 101794323 8/2010
CN 104217224 12/2014
(Continued)

OTHER PUBLICATIONS

International Search Report and Written Opinion issued in corresponding PCT Patent Application No. PCT/EP2017/073914, dated Dec. 20, 2018.
(Continued)

*Primary Examiner* — Peter B Kim
(74) *Attorney, Agent, or Firm* — Pillsbury Winthrop Shaw Pittman LLP

(57) ABSTRACT

A method including: obtaining data based an optical proximity correction for a spatially shifted version of a training design pattern; and training a machine learning model configured to predict optical proximity corrections for design patterns using data regarding the training design pattern and the data based on the optical proximity correction for the spatially shifted version of the training design pattern.

20 Claims, 24 Drawing Sheets

Related U.S. Application Data continuation of application No. 16/640,500, filed as application No. PCT/EP2018/073914 on Sep. 5, 2018, now Pat. No. 11,561,477.

(60) Provisional application No. 62/556,246, filed on Sep. 8, 2017, provisional application No. 62/725,734, filed on Aug. 31, 2018.

(58) Field of Classification Search
CPC ........ G06N 20/10; G06N 20/20; G06N 3/045; G06N 3/08; G06N 5/01; G06N 5/047; G06V 10/44; G06V 10/46; G06V 10/774; G06V 10/82
See application file for complete search history.

(56) References Cited

U.S. PATENT DOCUMENTS

| | | | |
|---|---|---|---|
| 9,111,062 | B2 | 8/2015 | Chen et al. |
| 9,129,352 | B2 | 9/2015 | Jeong |
| 9,223,926 | B2 | 12/2015 | Soulan |
| 2007/0031745 | A1 | 2/2007 | Ye et al. |
| 2007/0050749 | A1 | 3/2007 | Ye et al. |
| 2008/0229273 | A1 | 9/2008 | Lorusso et al. |
| 2008/0301620 | A1 | 12/2008 | Ye et al. |
| 2008/0309897 | A1 | 12/2008 | Wong et al. |
| 2010/0162197 | A1 | 6/2010 | Ye et al. |
| 2010/0180251 | A1 | 7/2010 | Ye et al. |
| 2014/0064600 | A1 | 3/2014 | Jeong |
| 2015/0213374 | A1 | 7/2015 | Agarwal |
| 2017/0357911 | A1 | 12/2017 | Liu et al. |
| 2018/0293721 | A1* | 10/2018 | Gupta .................... G06N 3/045 |
| 2018/0314163 | A1 | 11/2018 | Liu |

FOREIGN PATENT DOCUMENTS

| | | |
|---|---|---|
| CN | 106777829 | 5/2017 |
| JP | 2006058452 | 3/2006 |
| KR | 20140030007 | 3/2014 |
| KR | 20140075695 | 6/2014 |
| KR | 20170096018 | 8/2017 |
| TW | 201428817 | 7/2014 |
| TW | 201727521 | 8/2017 |
| WO | 2016096308 | 6/2016 |

OTHER PUBLICATIONS

Taiwanese Office Action issued in corresponding Taiwanese Patent Application No. 107131404, dated Dec. 19, 2019.
Krizhevsky, A. et al.: "ImageNet Classification with Deep Convolutional Neural Networks", Advances in Neural Information Processing Systems 25, 2012.
Szegedy, C. et al.: "Going Deeper with Convolutions," 2015 IEEE Conference on Computer Vision and Pattern Recognition, 2015.
Simonyan, K. et al.: "Very Deep Convolutional Networks for Large-Scale Image Recognition", International Conference on Learning Representations, 2015.
He, K. et al., "Deep Residual Learning for Image Recognition", 2016 IEEE, Conference on Computer Vision and Pattern Recognition, 2016.
Yang, H. et al.: "Imbalance Aware Lithography Hotspot Detection: A Deep Learning Approach", Proc. of SPIE, vol. 10148, Mar. 28, 2017.
Shin, M. et al.: "Accurate lithography hotspot detection using deep convolutional neural networks", J. Micro/Nanolith, MEMS and MOEMS, vol. 15(4), Oct. 2016.
Shen, Y. et al.: "Level-set-based inverse lithography for photomask synthesis", Optics Express, vol. 17, No. 26, Dec. 21, 2009.
Spence, C.: "Full-chip lithography simulation and design analysis: how OPC is changing IC design", Proc. of SPIE, vol. 5751, May 6, 2005.
Korean Office Action issued in corresponding Korean Patent Application No. 10-2022-7018451, dated Sep. 15, 2022.
Chinese Office Action issued in corresponding Chinese Patent Application No. 201880058150.4, dated Aug. 12, 2021.
Taiwanese Office Action issued in corresponding Taiwanese Patent Application No. 109121063, dated Jun. 8, 2021.
Taiwanese Office Action issued in corresponding Taiwanese Patent Application No. 111100057, dated Dec. 7, 2022.

* cited by examiner

TRAINING METHODS FOR MACHINE LEARNING ASSISTED OPTICAL PROXIMITY ERROR

This application is a continuation of U.S. patent application Ser. No. 18/089,007, filed Dec. 27, 2022, which is a continuation of U.S. patent application Ser. No. 16/640,500, filed Feb. 20, 2020, now U.S. Pat. No. 11,561,477, which is a U.S. national phase entry of PCT Patent Application No. PCT/EP2018/073914, which was filed on Sep. 5, 2018, which claims the benefit of priority of U.S. Patent Application No. 62/556,246, which was filed on Sep. 8, 2017, and of U.S. Patent Application No. 62/725,734, which was filed on Aug. 31, 2018, each of the foregoing applications is incorporated herein in its entirety by reference.

TECHNICAL FIELD

The description herein relates to lithographic apparatuses and processes, and more particularly to a tool and a method to make optical proximity error corrections of a design layout.

BACKGROUND

A lithographic apparatus can be used, for example, in the manufacture of integrated circuits (ICs) or other devices. In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic apparatus will have a magnification factor M (generally<1), the speed F at which the substrate is moved will be a factor M times that at which the projection beam scans the patterning device.

Prior to the device fabrication procedure of transferring the pattern from the patterning device to the substrate of the device manufacturing process, the substrate may undergo various device fabrication procedures of the device manufacturing process, such as priming, resist coating and a soft bake. After exposure, the substrate may be subjected to other device fabrication procedures of the device manufacturing process, such as a post-exposure bake (PEB), development, and a hard bake. This array of device fabrication procedures is used as a basis to make an individual layer of a device, e.g., an IC. The substrate may then undergo various device fabrication procedures of the device manufacturing process such as etching, ion-implantation (doping), metallization, oxidation, chemo-mechanical polishing, etc., all intended to finish off the individual layer of the device. If several layers are required in the device, then the whole process, or a variant thereof, is repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

So, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

SUMMARY

In an embodiment, there is provided a method comprising: obtaining training data set including an optical proximity correction corresponding to a spatially shifted version of a training design pattern; and training, by a hardware computer system, a machine learning model configured to predict optical proximity corrections for design patterns using data regarding the spatially shifted version of the training design pattern and data based on the optical proximity correction for the spatially shifted version of the training design pattern.

In an embodiment, there is provided a method comprising: obtaining one or more spatially shifted versions of a design pattern and corresponding spatially shifted version of optical proximity correction image for each of the one or more shifted design patterns; selecting, by a hardware computer system, one or more optical proximity correction images of the one or more shifted design patterns having a process window metric meeting or passing a threshold; and training, by the hardware computer system, a machine learning model using training data comprising data regarding one or more spatially shifted versions of the design pattern and data regarding the selected one or more optical proximity correction images.

In an embodiment, there is provided a method comprising: obtaining a weighting function or data to assign a different weight to a region of an optical proximity correction of a design pattern than another region thereof; and training, by a hardware computer system, a machine learning model configured to predict optical proximity corrections for design patterns by evaluating a predicted optical proximity correction of the design pattern by the machine learning model against a benchmark optical proximity correction of the design pattern based on the weighting data.

In an embodiment, there is provided a method comprising: obtaining a benchmark optical proximity correction for a design pattern; generating, by a hardware computer system, a predicted optical proximity correction for the design pattern using a machine learning model; assigning, by the hardware computer system, a relatively high weight at a portion of the predicted and/or benchmark optical proximity correction; and training, by the hardware computer system, the machine learning model using an objective function evaluating the weighted predicted and/or benchmark optical proximity corrections.

In an embodiment, there is provided a method comprising: applying, by a hardware computer system, a binarization function to image data of a predicted optical proximity correction of a design pattern by a machine learning model and/or a benchmark optical proximity correction of the design pattern to produce a respective binarized version thereof; and training, by a hardware computer system, a machine learning model configured to predict optical proximity corrections for design patterns by evaluating the predicted optical proximity correction against the benchmark optical proximity correction based on the binarized version of the predicted and/or benchmark optical proximity correction.

In an embodiment, there is provided a method comprising: obtaining a benchmark optical proximity correction image for a design pattern; generating, by a hardware computer system, a predicted optical proximity correction image for the design pattern using a machine learning model; transforming, by the hardware computer system, the predicted and benchmark optical proximity correction images using a binarization function into respective binary images; evaluating, by the hardware computer system, data of the binary image of benchmark optical proximity correction image against data of the binary image of the predicted optical proximity correction image; and adjusting, by the hardware computer system, a parameter of the machine learning model based on the evaluation.

In an embodiment, there is provided a method comprising: processing, by a hardware computer system, image data of a predicted optical proximity correction of a design pattern by a machine learning model and/or a benchmark optical proximity correction of the design pattern to identify edge locations of an optical proximity correction; and training, by a hardware computer system, a machine learning model configured to predict optical proximity corrections for design patterns by evaluating the predicted optical proximity correction against the benchmark optical proximity correction based on data from the identified edge locations.

In an embodiment, there is provided a method comprising: obtaining a benchmark optical proximity correction image for a design pattern; generating, by a hardware computer system, a predicted optical proximity correction image for the design pattern using a machine learning model; identifying, by the hardware computer system, edge locations of features within the predicted and benchmark optical proximity correction images; evaluating, by the hardware computer system, data at identified edge locations of the benchmark optical proximity correction image against data at identified edge locations of the predicted optical proximity correction image; and adjusting, by the hardware computer system, a parameter of the machine learning model based on the evaluation.

In an embodiment, there is provided a method comprising: obtaining a spatially shifted version of an input design pattern; and training, by a hardware computer system, a machine learning model configured to predict optical proximity corrections for design patterns using an objective function that has a penalty term, the penalty term involving a comparison between a value corresponding to a prediction made by the machine learning model with respect to the input design pattern and a value corresponding to an inversely shifted version of a prediction made by the machine learning model with respect to the shifted input design pattern, wherein the inverse shift is a spatial shift that is inverse to the spatial shift used to create the spatially shifted version of the input design pattern.

In an embodiment, there is provided a computer program product comprising a computer readable medium having instructions recorded thereon, the instructions when executed by a computer implementing any method herein or any part thereof.

The foregoing general description of the illustrative implementations and the following detailed description thereof are merely exemplary aspects of the teachings of this disclosure, and are not restrictive.

BRIEF DESCRIPTION OF FIGURES

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying graphs and figures are for illustration purposes only and may or may not represent actual or preferred values or dimensions. Where applicable, some or all features may not be illustrated to assist in the description of underlying features. In the drawings.

DETAILED DESCRIPTION

Figure 1:
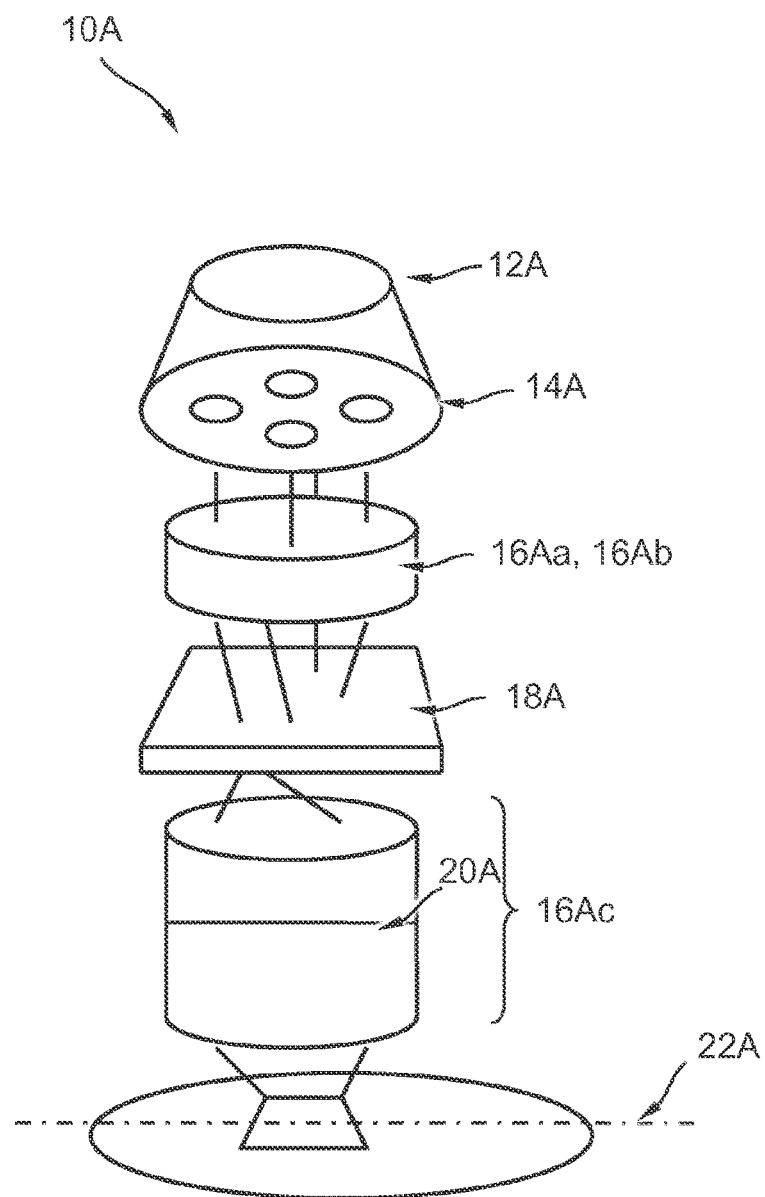
FIG. 1 is a block diagram of various subsystems of a lithography system according to an exemplary embodiment of the present disclosure.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details. In some instances, well-known structures and components may be shown in block diagram form in order to avoid obscuring the concepts of the disclosed subject matter.

As semiconductor or other device manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic apparatuses that project a design layout onto a substrate using illumination from a deep-ultraviolet (e.g., 193 nm) illumination source or an extreme-ultraviolet (e.g., 13.52 nm) illumination source, creating individual functional elements having dimensions well below 30 nm.

This process in which features with dimensions smaller than the classical resolution limit of a lithographic apparatus are printed, is commonly known as low-k1 lithography, according to the resolution formula $CD=k1 \times \lambda/NA$, where $\lambda$ is the wavelength of radiation employed (currently in most cases 248 nm or 193 nm), NA is the numerical aperture of projection optics in the lithographic apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic apparatus or the design layout. These include, for example, but not limited to, optimization of NA and optical coherence settings, customized illumination schemes, use of phase shifting patterning devices, optical proximity correction (OPC) in the design layout, or other methods generally defined as "resolution enhancement techniques" (RET).

As an example of RET, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, the term "mask," "patterning device" and "design layout" can be used interchangeably, as in the context of RET, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

One of the simplest forms of OPC is selective bias. Given a CD vs. pitch curve, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of integrated circuit design and manufacturing is to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the design layout. The terms "main feature" and "assist feature" do not imply that a particular feature on a patterning device must be labeled as one or the other.

As a brief introduction, FIG. 1 illustrates an exemplary lithographic projection apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic projection apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

Figure 2:
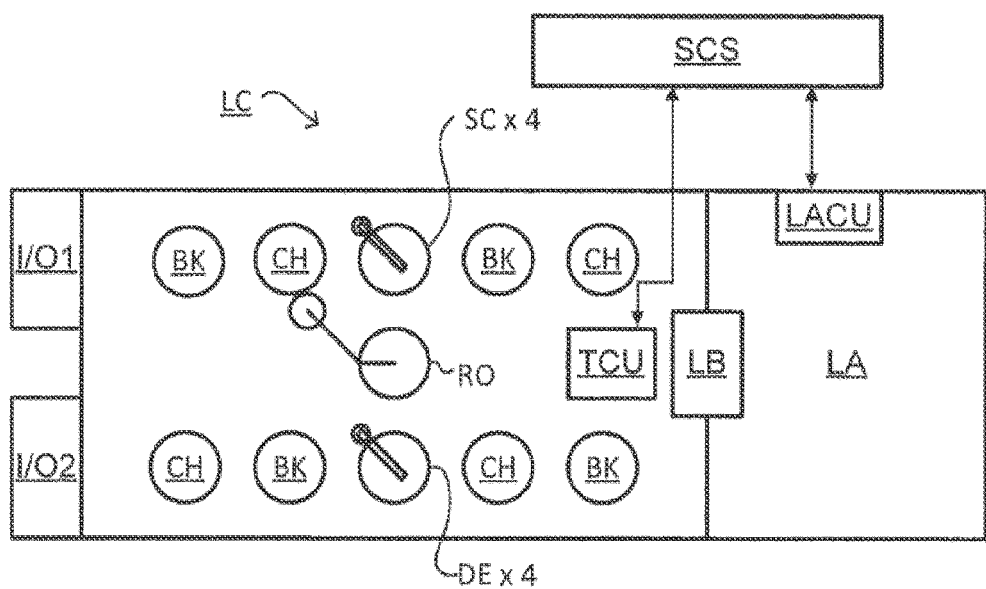
FIG. 2 schematically depicts an embodiment of a lithographic cell or cluster according to an exemplary embodiment of the present disclosure.

In a lithographic projection apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety As shown in FIG. 2, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput (e.g., substrates processed per unit time) and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc. The measuring device may be incorporated in the lithographic apparatus LA. An embodiment of the present disclosure may be implemented in or with the supervisory control system SCS or the lithographic control unit LACU. For example, data from the supervisory control system SCS or the lithographic control unit LACU may be used by an embodiment of the present disclosure and one or more signals from an embodiment of the present disclosure may be provided to the supervisory control system SCS or the lithographic control unit LACU.

Figure 3:
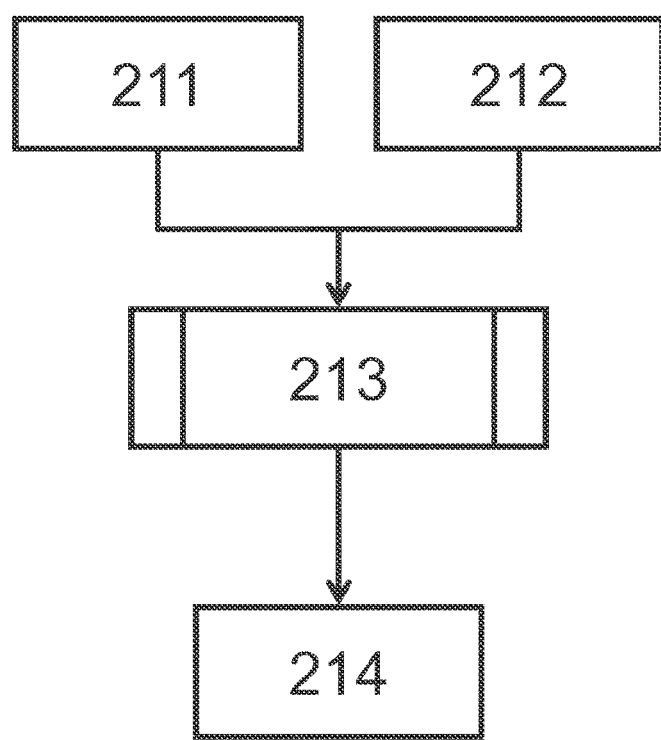
FIG. 3 schematically depicts a method of placing assist features (assist features connected to main features or independent assist features) into a design layout according to an exemplary embodiment of the present disclosure.

FIG. 3 schematically depicts a method of making optical proximity corrections in a design layout. The design layout may be a design layout before application of a RET or a design layout after application of a RET. The design layout may be binary or continuous tone. In this disclosure, focus is made on placing assist features (assist features connected to main features or independent assist features) into a design layout as an example optical proximity correction to which the techniques herein can be applied. As will be appreciated, the techniques herein can be applied to alternative optical proximity corrections than assist features (such as bias, etc.) or applied to optical proximity corrections in addition to assist features (e.g., a combination of bias and assist features).

A computational or an empirical model 213 can be used to apply (e.g., determining one or more characteristics, such as the existence, location, type, shape, etc., of) one or more optical proximity corrections such as one or more assist features. The model 213 can take into account one or more characteristics 211 (also referred to as a processing parameter) of the device manufacturing process, or one or more design layout parameters 212, or both. The one or more processing parameters 211 are one or more parameters associated with the device manufacturing process but not with the design layout. For example, the one or more processing parameters 211 may include a characteristic of the illumination (e.g., intensity, pupil profile, etc.), a characteristic of the projection optics, dose, focus, a characteristic of the resist, a characteristic of development of the resist, a characteristic of post-exposure baking of the resist, or a characteristic of etching. The one or more design layout parameters 212 may include one or more shapes, sizes, relative locations, or absolute locations of various features on a design layout, and also overlapping of features on different design layouts. In an empirical model, the image (e.g., resist image, optical image, etch image) is not simulated; instead, the empirical model makes an optical correction (e.g., places an assist feature) based on a correlation between the input (e.g., the one or more processing parameters 211 and/or the design layout parameters 212) and the optical proximity correction. In a computational model, a portion or a characteristic of the image is calculated, and the optical proximity correction is applied based on the portion or the characteristic of the calculated image.

An example of an empirical model is a machine learning model. Both unsupervised machine learning and supervised machine learning models may be used to make an optical proximity correction (e.g., placement of assist features). Without limiting the scope of the present disclosure, applications of supervised machine learning algorithms are described below.

Supervised learning is the machine learning task of inferring a function from labeled training data. The training data includes a set of training examples. In supervised learning, each example is a pair having an input object (typically a vector) and a desired output value (also called the supervisory signal). A supervised learning algorithm analyzes the training data and produces an inferred function, which can be used for mapping new examples. In an embodiment, an optimal scenario will allow the algorithm to correctly determine the class labels for unseen instances. This requires the learning algorithm to generalize from the training data to unseen situations in a "reasonable" way.

Given a set of N training examples of the form $\{(X_1, y_1), (x_2, y_2), \ldots, (x_N, y_N)\}$ such that $x_i$ is the feature vector of the i-th example and $y_i$ is its label (i.e., class), a learning algorithm seeks a function g: X→Y, where X is the input space and Y is the output space. A feature vector is an n-dimensional vector of numerical features that represent some object. Many algorithms in machine learning require a numerical representation of objects, since such representations facilitate processing and statistical analysis. When representing images, the feature values might correspond to the pixels of an image, when representing texts perhaps term occurrence frequencies. The vector space associated with these vectors is often called the feature space. The function g is an element of some space of possible functions G, usually called the hypothesis space. It is sometimes convenient to represent g using a scoring function f: X×Y→ ℝ such that g is defined as returning they value that gives the highest score:

$$R_{emp}(g) = \frac{1}{N}\Sigma_i \, L(y_i, g(x_i)).$$

denotes the space of scoring functions. Although G and F can be any space of functions, many learning algorithms are probabilistic models where g takes the form of a conditional probability model g(x)=P(y|x), or f takes the form of a joint probability model f(x, y)=P(x, y). For example, naive Bayes and linear discriminant analysis are joint probability models, whereas logistic regression is a conditional probability model.

There are two basic approaches to choosing f or g: empirical risk minimization and structural risk minimization. Empirical risk minimization seeks the function that best fits the training data. Structural risk minimization includes a penalty function that controls the bias/variance tradeoff.

In both cases, it is assumed that the training set has a sample of independent and identically distributed pairs $(x_i, y_i)$. In order to measure how well a function fits the training data, an objective function is typically defined. For, a cost or loss function L: Y×Y→ℝ$^{\geq 0}$ can be defined. In this situation, for training example $(x_i, y_i)$, the loss of predicting the value $\hat{y}$ is $L(y_i, \hat{y})$. The risk R(g) of function g is defined as the expected loss of g. This can be estimated from the training data as $$g(x) = \arg\max_y \, f(x, y),$$

Exemplary models of supervised learning include decision trees, ensembles (bagging, boosting, random forest), k-NN, linear regression, naive Bayes, neural networks, logistic regression, perceptron, support vector machine (SVM), relevance vector machine (RVM), and deep learning.

SVM is an example of supervised learning model, which analyzes data and recognizes patterns and can be used for classification and regression analysis. Given a set of training examples, each marked as belonging to one of two categories, a SVM training algorithm builds a model that assigns new examples into one category or the other, making it a non-probabilistic binary linear classifier. A SVM model is a representation of the examples as points in space, mapped so that the examples of the separate categories are divided by a clear gap that is as wide as possible. New examples are then mapped into that same space and predicted to belong to a category based on which side of the gap they fall on. In addition to performing linear classification, SVMs can efficiently perform a non-linear classification using what is called the kernel methods, implicitly mapping their inputs into high-dimensional feature spaces.

Kernel methods involve a user-specified kernel, i.e., a similarity function over pairs of data points in raw representation. Kernel methods owe their name to the use of kernel functions, which enable them to operate in a high-dimensional, implicit feature space without ever computing the coordinates of the data in that space, but rather by simply computing the inner products between the images of all pairs of data in the feature space. This operation is often computationally cheaper than the explicit computation of the coordinates. This approach is called the "kernel trick."

The effectiveness of SVM depends on the selection of kernel, the kernel's parameters, and soft margin parameter C. A common choice is a Gaussian kernel, which has a single parameter γ. The best combination of C and γ is often selected by a grid search (also known as "parameter sweep") with exponentially growing sequences of C and γ, for example, C ⊂ $\{2^{-5}, 2^{-4}, \ldots, 2^{15}, 2^{16}\}$; γ∈ $\{2^{-15}, 2^{-14}, \ldots, 2^4, 2^5\}$.

A grid search is an exhaustive searching through a manually specified subset of the hyperparameter space of a learning algorithm. A grid search algorithm is guided by some performance metric, typically measured by cross-validation on the training set or evaluation on a held-out validation set.

Each combination of parameter choices may be checked using cross validation, and the parameters with best cross-validation accuracy are picked.

Cross-validation, sometimes called rotation estimation, is a model validation technique for assessing how the results of a statistical analysis will generalize to an independent data set. It is mainly used in settings where the goal is prediction, and one wants to estimate how accurately a predictive model will perform in practice. In a prediction problem, a model is usually given a dataset of known data on which training is run (training dataset), and a dataset of unknown data (or first seen data) against which the model is tested (testing dataset). The goal of cross validation is to define a dataset to "test" the model in the training phase (i.e., the validation dataset), in order to limit problems like overfitting, give an insight on how the model will generalize to an independent data set (i.e., an unknown dataset, for instance from a real problem), etc. One round of cross-validation involves partitioning a sample of data into complementary subsets, performing the analysis on one subset (called the training set), and validating the analysis on the other subset (called the validation set or testing set). To reduce variability, multiple rounds of cross-validation are performed using different partitions, and the validation results are averaged over the rounds.

The final model, which can be used for testing and for classifying new data, is then trained on the entire training set using the selected parameters.

Another example of supervised learning is regression. Regression infers the relationships between a dependent variable and one or more independent variables, from a set of values of the dependent variables and corresponding values of the independent variables. Regression may estimate the conditional expectation of the dependent variable given the independent variables. The inferred relationships may be called the regression function. The inferred relationships may be probabilistic.

Figure 4A:
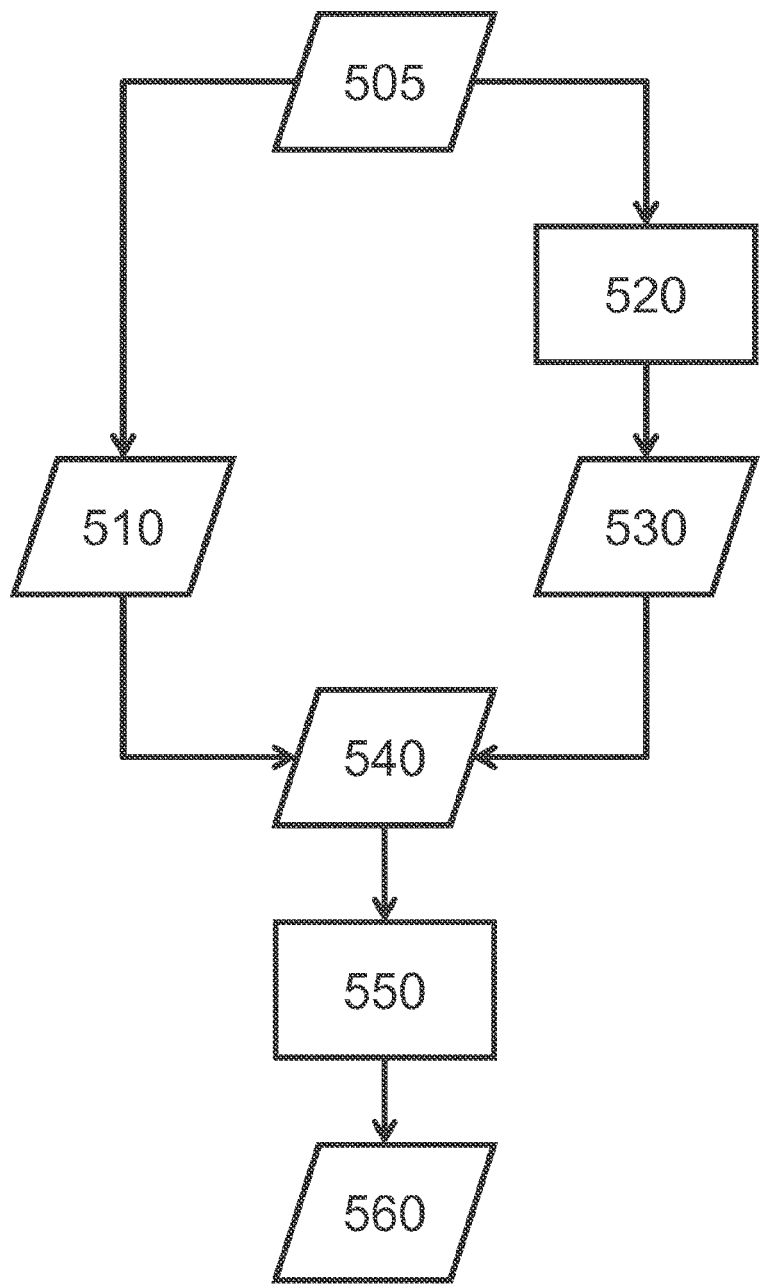
FIG. 4A and FIG. 4B schematically respectively show flows for a training a machine learning model and using a machine learning model according to an exemplary embodiment of the present disclosure.
Figure 4B:
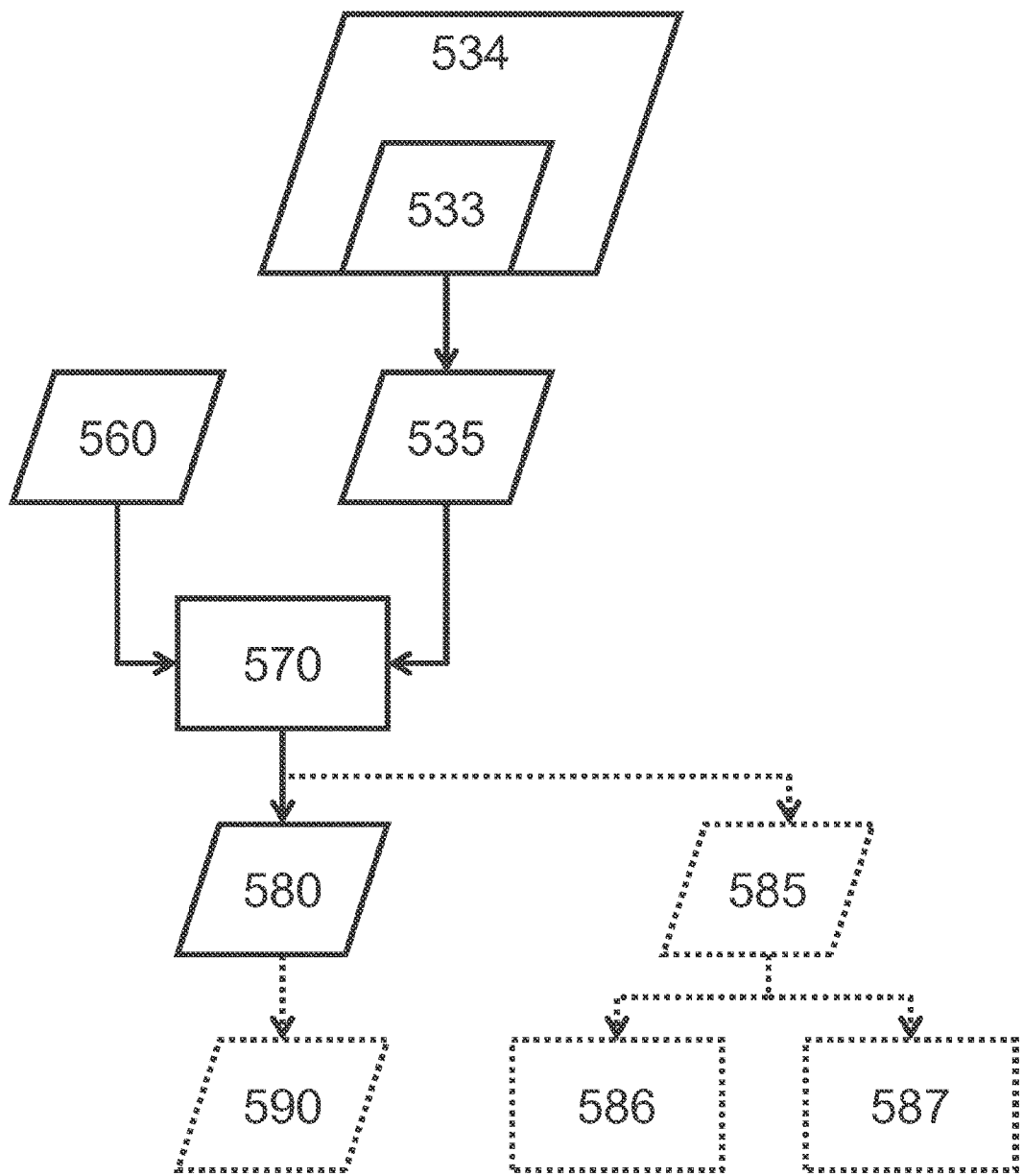

FIG. 4A and FIG. 4B schematically show respectively flows for a method of training a machine learning to place assist features (as an example of optical proximity correction) and use of a trained machine learning model to place assist features (as an example of optical proximity correction), according to an embodiment. FIG. 4A schematically shows a flow for training the machine learning model. One or more values of one or more characteristics 510 of a portion 505 of a design layout are obtained. The design layout may be a binary design layout, a continuous tone design layout (e.g., rendered from a binary design layout), or a design layout of another suitable form. The one or more characteristics 510 may include a geometrical characteristic (e.g., an absolute location, a relative location, or shape) of one or more patterns in the portion 505. The one or more characteristics 510 may include one or more statistical characteristics of the one or more patterns in the portion 505. Examples of a statistical characteristic of a pattern in the portion 505 may include an average or variance of a geometric dimension of one or more patterns. The one or more characteristics 510 may include parameterization of the portion 505 (i.e., one or more values of a function of the portion 505), such as projection on certain basis functions. The one or more characteristics 510 may include an image (pixelated, binary Manhattan, binary curvilinear, or continuous tone) or image data (e.g., pixel values with associated locations) derived from the portion 505. In general, image data may refer to any data (e.g., pixel values, locations, intensity, RBG values, etc.) associated with an image.

In procedure 520, one or more characteristics 530 of assist features are determined using any suitable method, based on the portion 505 or one or more characteristics 510 thereof. For example, the one or more characteristics 530 of assist features may be determined using a method described in U.S. Pat. No. 9,111,062, or described Y. Shen, et al., *Level-Set-Based Inverse Lithography For Photomask Synthesis*, Optics Express, Vol. 17, pp. 23690-23701 (2009), the disclosures of which are hereby incorporated by reference in their entirety, and/or any other techniques described herein or in any document incorporated by reference herein. For example, the one or more characteristics 530 may include one or more geometrical characteristics (e.g., absolute location, relative location, or shape) of the assist features, one or more statistical characteristics of the assist features (such as an average or variance of a geometric dimension of the assist features), parameterization of the assist features (e.g., one or more values of a function of the assist features, such as projection on certain basis functions) or an image or image data of the assist features (e.g., a pixelated, binary Manhattan, binary curvilinear, or continuous tone image and/or pixel values with associated locations).

Values of the one or more characteristics 510 of the portion of the design layout and the one or more characteristics 530 of the assist features are included in training data 540 as a sample. In an embodiment, the one or more characteristics 510 are included in the feature vector (also called the input vector) of the sample and the one or more characteristics 530 are included in the label (also called the supervisory signal or answer vector) of the sample. In procedure 550, a machine learning model 560 is trained using the training data 540. As noted above, an objective function (e.g., a loss or cost function) may be used in the training.

FIG. 4B schematically shows a flow for using the machine learning model 560 to place one or more assist features. A portion 533 of a design layout 534 or one or more characteristics 535 of the portion is obtained. Neither the portion 533 nor any other portion of the design layout 534 has to be part of the training data. The portion 533 may be a portion in a vicinity of an edge of the design layout 534. The one or more characteristics 535 may include one or more geometrical characteristics (e.g., absolute location, relative location, or shape) of one or more patterns in the portion 533. The one or more characteristics 535 may include one or more statistical characteristics of the one or more patterns in the portion 533. The one or more characteristics 535 may include parameterization of the portion 533, such as projection on certain basis functions. The one or more characteristics 535 may include an image (pixelated, binary Manhattan, binary curvilinear, or continuous tone) or image data (e.g., pixel values with associated locations) derived from the portion 533. For example, if the portion 533 is a portion in a vicinity of an edge of the design layout 534, the one or more characteristics 535 may be relative to the edge as a reference (e.g., a pixelated, binary Manhattan, binary curvilinear, or gray-scale image or a projection onto a basis, obtained using the edge as a reference), thereby the one or more characteristics 535 do not change even if the edge is moved relative to a reference fixed in the design layout, as further explained below in reference to FIG. 4C, 4D and FIG. 4E.

In procedure 570, the portion 534 or the one or more characteristics 535 are provided as input into the machine learning model 560 and one or more characteristics 580 of one or more assist features for the portion 533 are obtained as output from the machine learning model 560. The one or more characteristics 580 may include the one or more geometrical characteristics (e.g., absolute location, relative location, or shape) of the assist features. The one or more characteristics 580 may include parameterization of the assist features, such as projection on certain basis functions. The one or more characteristics 580 may include an image (pixelated, binary Manhattan, binary curvilinear, or continuous tone) or image data (e.g., pixel values with associated locations) of the assist features. The one or more characteristics 580 of the assist features may be adjusted to avoid conflicts among them, for example, using a method described in U.S. Patent Application Publication No. 2008/0301620, the disclosure of which is incorporated by reference in its entirety.

In optional procedure 590, a substrate is patterned using the portion 533 of the design layout 534 and the assist features, in a lithographic process.

In procedure 570, the machine learning model 560 may optionally compute a confidence metric 585, which indicates the trustworthiness of the one or more characteristics 580. For example, when the one or more characteristics 580 include a binary image (e.g., binary Manhattan image, binary curvilinear image) of the assist features, the confidence metric may be the probability for either tones of the binary image. Some machine learning models, such as naive Bayes, logistic regression and multilayer perceptron (when trained under an appropriate loss function) are naturally probabilistic. A probabilistic model outputs a probability distribution over a set of classes, rather than only outputting the most likely class that the input should belong to. Some other machine learning models such as support vector machines are not naturally probabilistic, but methods exist to turn them into probabilistic classifiers. A regression problem may be converted to a multi-class classification problem and then use probability as a metric, or use a bootstrap method to build many models and then calculate the variance of the model predictions. The confidence metric (e.g., entropy, GI NI index, etc.) may be computed based on an output (e.g., a probability distribution over a set of classes) of the machine learning model.

Other forms of the confidence metric 585 may be possible. For example, for those portions of a design layout that are very different from the portions in the training data, the machine learning model has a relative high chance to be problematic. The confidence metric 585 that measures the similarity between the portion of the input and the portions in the training data may be constructed in a suitable way. A maximum Euclidean distance between the portion in the input and each of the portions of the training data can be such an example. In another example, the portions of the training data may be clustered into several groups and the Euclidean distances of the image of the input to the centers of each group may be used as the confidence metric 585.

If the confidence metric 585 fails to satisfy a condition (e.g., for indicating that the one more characteristics 580 are not sufficiently trustworthy), the one or more characteristics 580 may be disregarded and an assist feature may be placed using a different method (e.g., a method described in U.S. Pat. No. 9,111,062) in optional procedure 586 or the machine learning model 560 may be retrained, in optional procedure 587 (e.g., using the flow in FIG. 4A), using training data including the one or more characteristics 535 in the input that lead to the confidence metric 585 that fails the condition.

The assist feature whose characteristic 580 is produced by the machine learning model 570, in combination with the portion 533 of the design layout 534 may be used as an initial condition for another RET, such as OPC, illumination and patterning device pattern optimization (sometimes referred to as SMO), patterning device optimization (MO), or as an initial condition of a rigorous optimizer to speed up convergence. This is another use case.

Figure 4C:
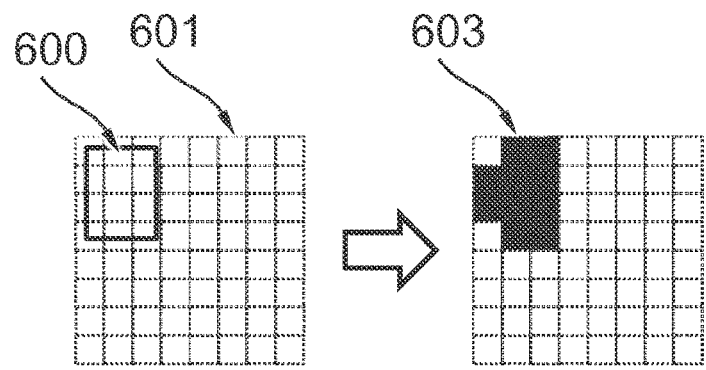
FIGS. 4C and 4D schematically show more details of pixelation using an edge of the design layout as reference according to an exemplary embodiment of the present disclosure.
Figure 4D:
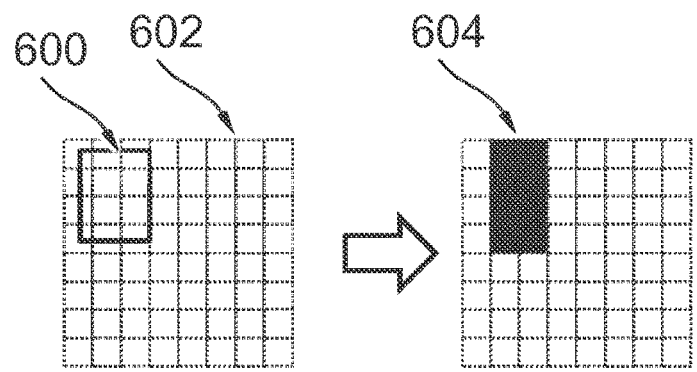

FIGS. 4C and 4D schematically show more details of pixelation. The pixelated image of a feature 600 may depend on the selection of a reference. For example, as shown in FIG. 4C, the pixelated image of the feature 600 using a reference 601 is pixelated image 603 but the pixelated image of the same feature 600 using a reference 602, which is merely shifted relative to the reference 601, is pixelated image 604, which is different from the pixelated image 603. To avoid this dependency of pixelation on the selection of the reference, a reference aligned to an edge (e.g., the right edge here) of, e.g., the feature 600, or a corner of the feature 600, may be used for pixelation of the feature 600. The references for different features may be different.

Figure 4E:
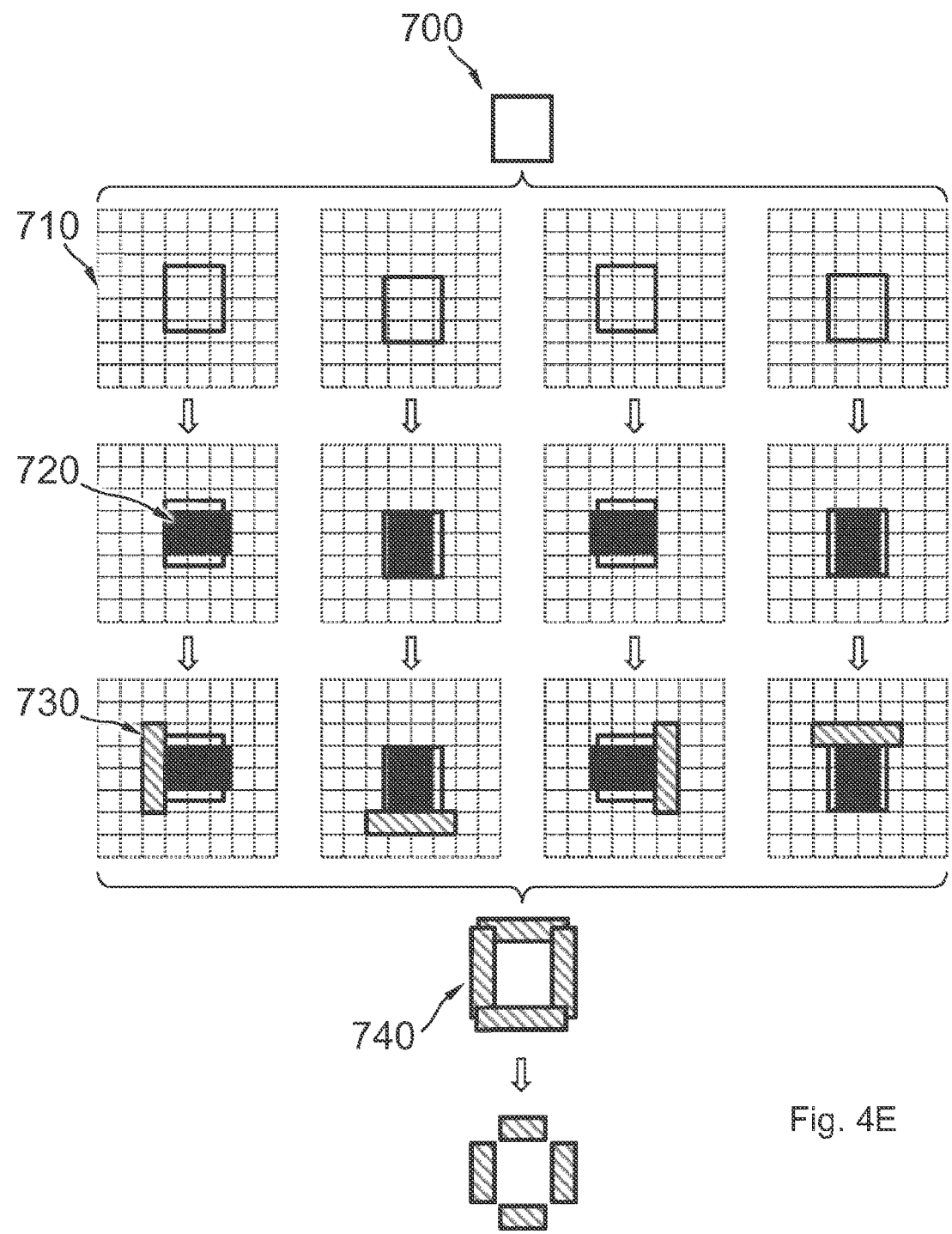
FIG. 4E schematically shows that a pixelated image of a feature may be determined using a reference aligned to each of the edges of the feature according to an exemplary embodiment of the present disclosure.

FIG. 4E schematically shows that a pixelated image 720 of a feature 700 may be determined using a reference 710 aligned to each of the edges of the feature 700. Each of the pixelated images 720 may be used as the characteristic 535 in the flow of FIG. 4B to obtain the one or more characteristic 580 of the assist features (e.g., shapes 730 of the assist features). Namely, for each edge, a set of one or more characteristics 580 of the assist features (e.g., shapes 730 of the assist features) is obtained. The set of one or more characteristics 580 (e.g., shapes 730 of the assist features) may be aligned with one another using the feature 700 as a reference, and merged together as a merged set of one or more characteristics of the assist feature (e.g., merged shapes 740 of the assist features). Conflicts in the merged set of one or more characteristics of the assist features may be then resolved (e.g., overlap in the merged shapes 740 removed). Though the pixelated image 720 is used here as an example of the one or more characteristics 535 obtained relative to an edge, the one or more characteristics 535 relative to the edge may be one or more other suitable characteristics such as a binary, or gray-scale image or a projection onto a basis, obtained using the edge as a reference.

As noted above, optical proximity correction modifies the design layout (of, for example, an advanced logic device) with the aim of, for example, providing sufficient process window (PW) for forming the design layout on a substrate. For example, an assist feature (as an example of OPC), particularly a SRAF, can modify the environment of isolated main features of the design layout in a manner such that the isolated features appear dense, which can enable scaling down of such main features by providing sufficient process window (PVV). So, an optical proximity correction that is sufficient, accurate and consistent throughout a full-chip is desired. But the run-time of the optical proximity correction should be fast to enable application of optical proximity correction to a full-chip in a timely manner.

Among optical proximity correction techniques, a model-based optical proximity correction approach can deliver a large process window (PW) with good accuracy and consistency, but often at the expensive of speed. For example, SMO-MO is an optical proximity correction technique that can deliver a large process window (PVV). In an embodiment, SMO-MO can use a SMO process to identify an optimum illumination and patterning device pattern (which optimization may be constrained in terms of the type of OPC corrections used, e.g., no application of assist features) and then that optimum illumination is used to further optimize the patterning device pattern in terms of optical proximity correction (e.g., application of assist features). In an embodiment, SMO-MO uses a gradient-based iterative approach to optimize a continuous tone patterning device pattern so that the associated cost function is minimized/maximized. In each iteration, the gradient map of the patterning device pattern is calculated and the gradient map is further used to guide the direction of the optimization (e.g., the application of OPC such as placement of assist features). SMO-MO can be highly accurate and may yield the largest process window; however the run-time can be prohibitive for full-chip applications.

Another model-based approach for optical proximity correction is use of a so-called SRAF Guidance Map (SGM) (see, e.g., U.S. Patent Application Publication No. US 2008-0301620 previously incorporated herein by reference), which is relatively faster than other approaches but can fall short on delivering an optimal process window.

Other full-chip optical proximity corrections are relatively faster than SMO-MO but each can have some disadvantages. For example, rule-based optical proximity correction approaches involve application of two-dimensional (2D) rules to apply optical proximity corrections (such as placement of assist features). But the determination and comprehensiveness of the rules can be difficult to implement and may not guarantee accuracy of 2D rules for logic applications.

In the context of assist features, their placement typically should have accuracy less than the size of the pixels used in image-based lithography simulation. For example the bar placement accuracy needs to be 1 nm or even 0.1 nm while lithography simulations uses a pixel size of 20 nm. Alternatively or additionally, consistency and/or symmetry in placement of assist features is highly desired. Consistency refers to repeating patterns in a patterning device pattern (e.g., a full chip patterning device pattern) having substantially similar assist feature placements. Assist feature placement should desirably have symmetry complying with the pattern symmetry and the illumination distribution shape symmetry (e.g., symmetry with a dipole or quadrupole illumination). But, existing techniques may not provide such accuracy, consistency and/or symmetry at a full chip level.

So, in an embodiment and as already described to some extent above with respect to FIGS. 3 and 4, a machine learning process can be advantageous to enabling accurate and complete application of optical proximity correction (such as placement of assist features) and can do so in a quick manner for, e.g., full chip applications.

While existing deep learning structures are available for deep learning tasks like image recognition, the machine learning techniques herein differ from such image recognition in many aspects including, but not limited to, the inputs provided to the machine learning model for training and for use of the trained machine learning model, the output from the machine learning model, a resolution desired, and/or an objective function used in training the machine learning model.

For example, to propagate the process window benefits of some of the techniques described above (such as SMO-MO) from clip level (which refers to a portion of the full chip patterning pattern) to the full chip patterning device pattern, a machine learning based optical proximity correction technique is described herein that takes, as training data, data from such other techniques at, for example, a clip level to enable the prediction of optical proximity correction by a machine learning model based on data regarding a patterning device pattern such as a full chip pattern. According to an embodiment, a machine learning model is trained using training data generated by SMO-MO and subsequently the trained model is applied to a full chip layout for optical proximity correction application.

Figure 5:
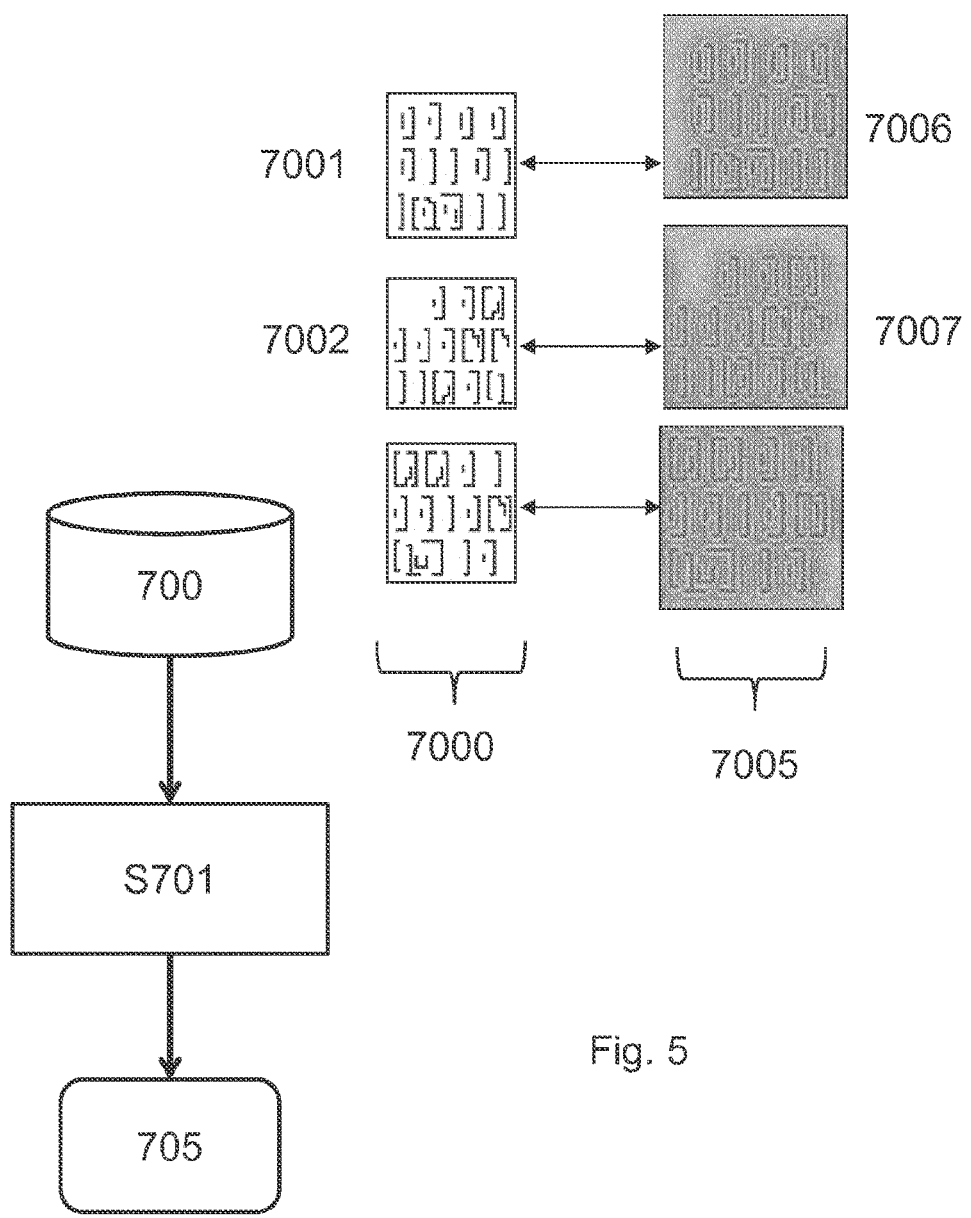
FIG. 5 is a flow chart for a method of training a machine learning model according to an exemplary embodiment of the present disclosure.

FIG. 5 is an example flow of training a machine learning model to build a trained machine learning model according to an exemplary embodiment of the present disclosure. In FIG. 5, training data 700 is provided. In an embodiment, the training data can be generated, or already be generated, using an optical proximity correction technique such as SMO-MO, a rule-based OPC method, etc. Desirably, the training data is highly accurate, consistent and enables a large process window. In an embodiment, the training data 700 includes data 7000 regarding input design patterns 7000 (e.g., clips from a full chip pattern) and data 7005 regarding an optical proximity correction of the associated input design patterns 7000. In an embodiment, the data can be the one or more characteristics regarding the design pattern layout and/or one or more characteristics regarding the optical proximity correction (e.g., assist feature) as described above. In an embodiment, the data 7000 and/or data 7005 comprises an image or pixel data of an image. In an embodiment, the data 7000 comprise an image or pixel data of an image of the design pattern (as illustrated in FIG. 5). In an embodiment, the data 7005 comprises a continuous transmission mask (CTM) map (as illustrated in FIG. 5 wherein the light gray adjacent the dark features corresponds to assist features such as SRAFs) corresponding to each of the design patterns of data 7000 that is generated using an optical proximity correction technique such as SMO-MO or an inverse OPC process. As will be appreciated, a continuous transmission mask map or equivalent thereof can be generated for a reflective patterning device (such as a reflective mask for EUV lithography) and will be for convenience referred to herein as a continuous transmission mask map. In an embodiment, 500 or more, 1000 or more, 1500 or more, 2000 or more, 2500 or more, 5000 or more, 10,000 or more, 100,000 or more, 1,000,000 or more combinations of data 7000 and data 7005 are provided as training data. In an embodiment, the patterns that correspond to the combinations of data 7000 and data 7005 are samples from the full chip pattern. In an embodiment, the samples are critical patterns, e.g., patterns known to have a higher than average probability of not forming correctly. In an embodiment, the patterns can be identified by a user as representative (e.g., by a chip manufacturer). In an embodiment, a pattern recognition technique can be used to identify the patterns in a full chip and identify occurrences of patterns in the full chip so as to select at least one of each repeating occurrence and a sampling across non-repeating occurrences. In an embodiment, a machine learning technique can be used to identify clusters of similar patterns and sample from at least each of the clusters.

In the training process S701, each of the data 7000 is evaluated with the data 7005 to progressively train the machine learning model such that the trained machine learning model when input with new or prior used data 7000 can accurately predict an optical proximity correction (e.g., placement of assist features) corresponding to the input data. That is, in an embodiment, the trained machine learning model can produce, if data 7000 were input, data that is similar to data 7005.

The training of the machine learning model may use a single training sample, several different training samples or all the samples available, and iteratively updating parameters of the model based on an objective function. In an embodiment, the training using the data 7000 and the data 7500 will typically involve evaluation of an objective function, such as the minimization of one or more cost functions, which are discussed in further detail in this disclosure. For example, in a first instance of the training process, first data 7001 regarding a first design pattern is input to the machine learning model, which model can create a prediction of optical proximity correction data corresponding to the first design pattern. However, that predicted data may substantially differ from corresponding first data 7006, which is considered as a benchmark or highly accurate (e.g., "truth"). In such a case, an objective function that performs the evaluation of the prediction relative to the benchmark can be used to align one or more parameters of the machine learning model (e.g., changing one or more coefficients of one or more formulas of the model, changing one or more powers of one or more terms in one or more formulas of the model, adding or removing one or more formulas, adding or removing one or more terms in one or more formulas of the model, etc.) to enable the machine learning model to make a better prediction. For example, a loss/cost function for the machine learning model that minimizes the difference between the data 7001 and the corresponding data 7006 can be used to tune the machine learning model. As will be appreciated, in a second instance, second data 7002 regarding a second design pattern is input to the training process of modified machine learning model, which model can predict optical proximity correction data corresponding to the second design pattern. That prediction may also differ from corresponding benchmark second data 7007. Again, the parameters of the machine learning model can be adjusted using the objective function (e.g., based on an evaluation of the difference between the prediction and the benchmark data 7006). The evaluation and adjustment of machine learning model parameters can continue until the trained machine learning model (i.e., progressively modified machine learning model) generates an optical proximity correct prediction for input data corresponding to a given design pattern that is the same or substantially to actual or expected benchmark data of the optical proximity correction of that given design pattern. So, in an embodiment, the objective function can involve a regression type analysis and the machine learning model configuration can involve a tracing of the parameters of model to the data using the regression techniques.

In an embodiment, machine learning training operates on a pixel basis. That is, in an embodiment, data 7000 comprises a pixelated image or data regarding pixels of an image and similarly, data 7005 comprises a pixelated image or data regarding pixels of an image. And so, the cost function and training evaluates the pixel data such that the machine learning model predicts pixel data for an optical proximity correction from the pixel data of an input design pattern. In an embodiment, pixel data refers to values related to a pixel within an image, where the values may be an intensity, contrast, RBG values, location within the image, or other similar pixel related information.

Figure 6:
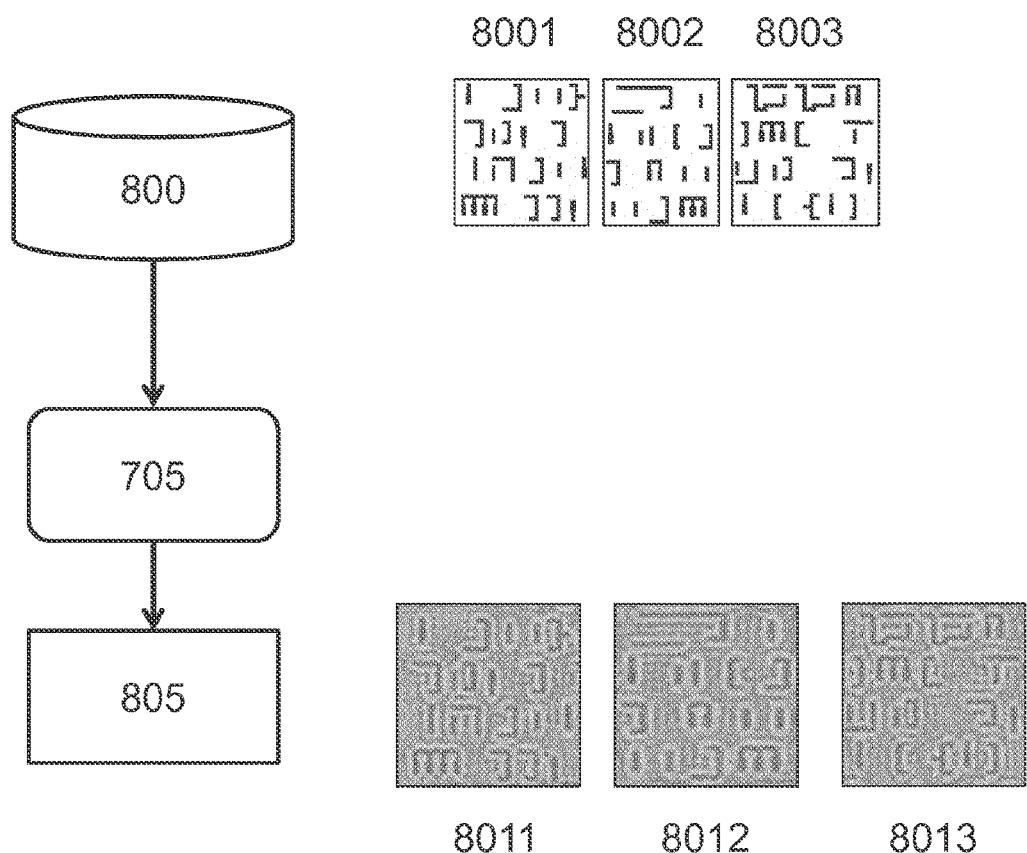
FIG. 6 is a flow chart for a method of using the machine learning model of FIG. 5 according to an exemplary embodiment of the present disclosure.

Once the machine learning model is trained, the trained machine learning model can be used to predict optical proximity correction data for any design patterns, as illustrated in FIG. 6. In FIG. 6, input data 800 to the trained machine learning model can be data regarding one or more design patterns such as data 8001, 8002, and 8003 regarding respective design patterns (as illustrated). The trained machine learning model 705 generates predicted optical proximity correction data 805 such as data 8011, 8012, and 8013 corresponding to respectively data 8001, 8002, and 8013, according to an exemplary embodiment of the present disclosure. As will be appreciated, the optical proximity correction data 805 can be used for various purposes, including, e.g., manufacture of a mask with a pattern in accordance with the optical proximity correction data for production, testing, etc. and/or further processing of a pattern in accordance with the optical proximity correction (such as application of further RET/OPC techniques including further processing using the same or different machine learning model). In an embodiment, the ML predictions can also be used as an initial condition for other rigorous optimizers to speed up the convergence.

Figure 7:
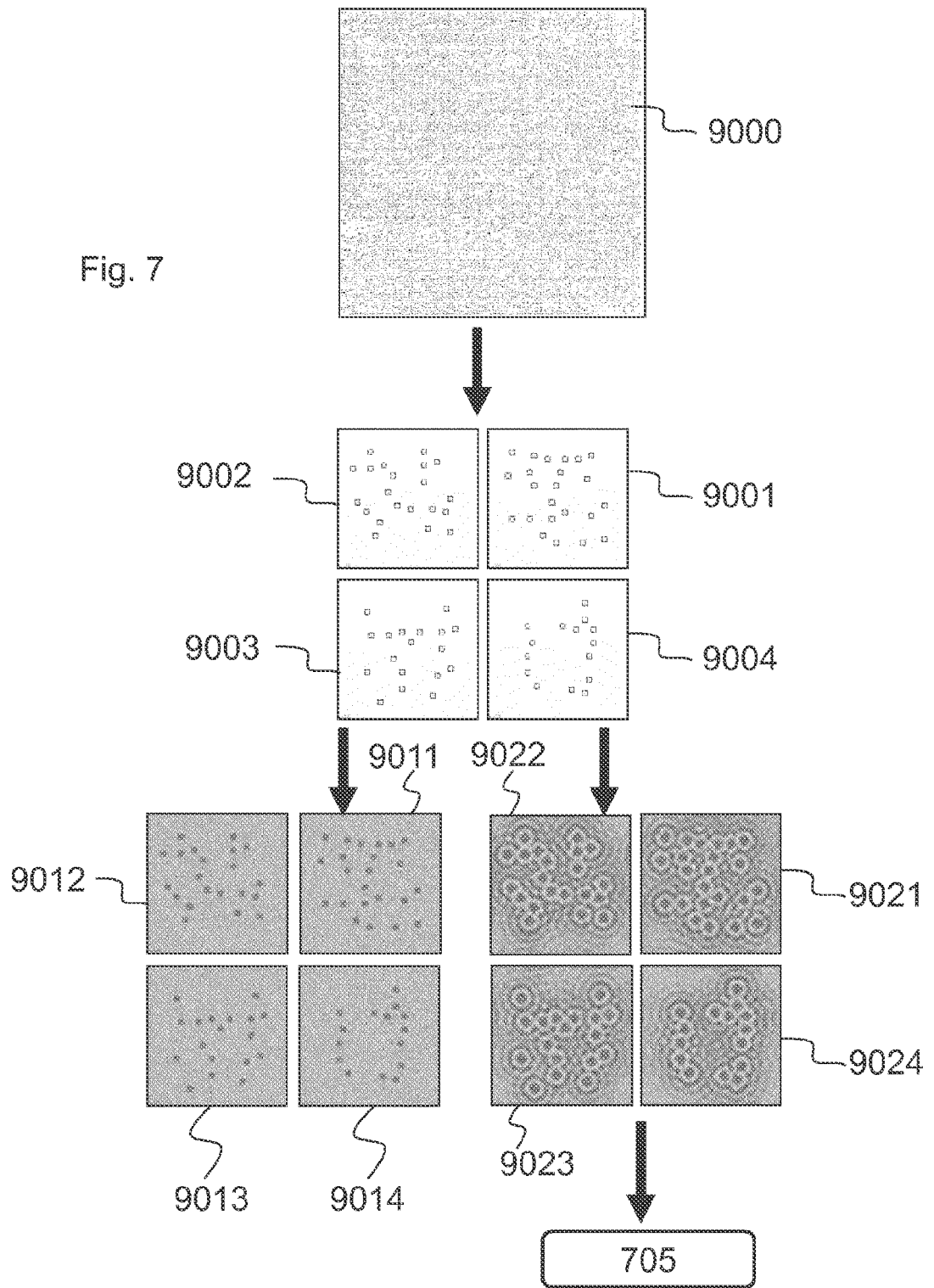
FIG. 7 is an example of training a machine learning model and a type of data used for the training according to an exemplary embodiment of the present disclosure.

FIG. 7 is an example of training a machine learning model and the associated data according to an exemplary embodiment of the present disclosure. In FIG. 7, one or more clips such as clips 9001, 9002, 9003, and 9004, can be samples from a full chip pattern 9000. In these example, the clips correspond to contact hole arrangements. As can be seen in full chip pattern 9000, there can be millions, if not billions, of patterns and thus represents the significant problems of accurately, consistently and quickly performing optical proximity correction on a full chip pattern. As described above, the samples can be based on, for example, heuristics of an experienced chip designer, frequency or spectrum analysis, machine learning based sampling, or a combination thereof.

In an embodiment, the sample clips 9001-9004 can be rendered into processed input data 9011, 9012, 9013, and 9014 such as rendered clips 9011, 9012, 9013, and 9014. In an embodiment, this rendering is not necessary. Here, the binarized clips 9001, 9002, 9003, and 9004 are transformed into gray level clips 9011, 9012, 9013, and 9014. An additional or alternative possibility for the rendering can include an initial RET applied to the clips, e.g., an application of SMO, biasing of one or more features in the clips, etc.

Further, the training process obtains optical proximity correction data 9021, 9022, 9023, and 9024 corresponding to the sample clips, such as CTM maps 9021-9024 (as illustrated in FIG. 7 wherein the light gray adjacent the dark features corresponds to assist features, such as SRAFs) corresponding to the sample clips 9001-9004, respectively. The data 9011-9014 and corresponding data 9021-9024 are then used to train the machine learning model 705.

In an embodiment, the machine learning model can be specific to a particular patterning device pattern. In other words, the machine learning model may be retrained for a different patterning device pattern. In some embodiments, one trained machine learning model may be used for several different patterning device patterns having similar clip patterns.

In an embodiment, the machine learning model is specific to a particular device manufacturing process used for the patterning device pattern. For example, the device manufacturing process may be configured in terms of a certain illumination type used, certain resist used, certain projection system settings, etc. One or more of those device manufacturing process parameters may be used in generating the "truth" data and so the machine learning model may be specific to a particular configuration of the device manufacturing process. As will be appreciated, the generation of the "truth" data may involve simulations that account for perturbations to one or more of the process parameters and so the machine learning model may be extend to variances of the particular configuration of the device manufacturing process. In an embodiment, if the particular configuration of the device manufacturing process is changed in material respects, a new machine learning model may need to be trained or a prior similar machine learning model may need to be retrained.

Figure 8:
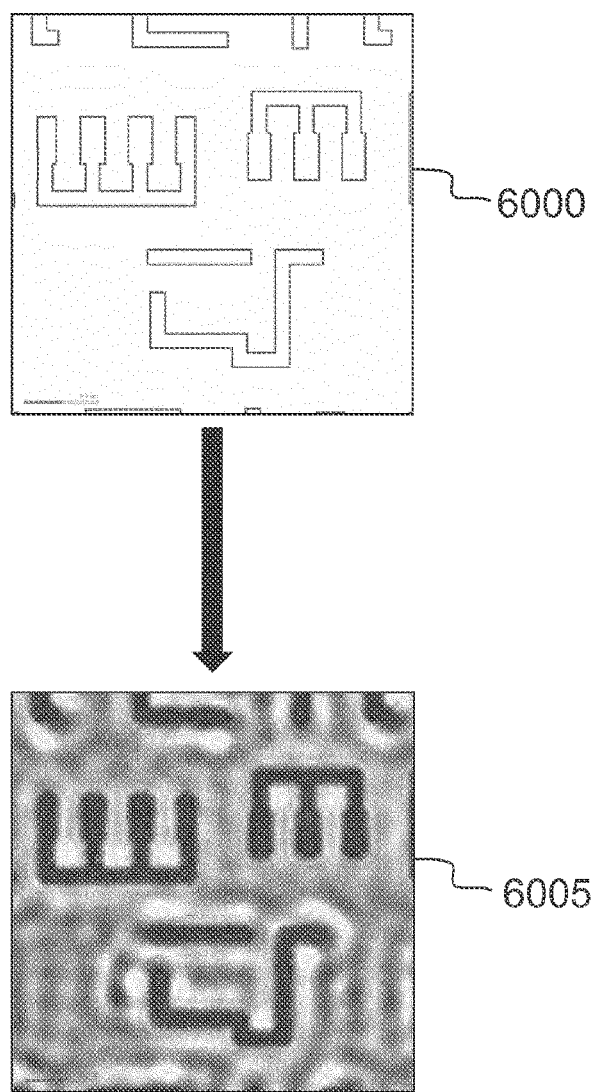
FIG. 8 illustrates an example assist feature map used to train or predicted by, a machine learning model according to an exemplary embodiment of the present disclosure.

In FIG. 8, an example input data 6000 of a design pattern (in this case, an image of the design pattern as illustrated in FIG. 8) according to an exemplary embodiment of the present disclosure is shown that can be input to the trained machine learning model 705 to generate predicted optical proximity correction data 6005, in this case a predicted map of the input design pattern with SRAFs applied (as illustrated in FIG. 8, the SRAFs are depicted as light gray adjacent the dark features). Alternatively or additionally, data 6000 can be input data to training the machine learning model and data 6005 corresponds to benchmark data for the design pattern of data 6000.

Now, further techniques are described regarding the training method for the machine learning model and methods to improve the machine learning model quality. These techniques can be applied to any of the machine learning methods and flows described herein and so can be used to create new models or retrain existing models. Desirably, these further techniques enable generation of a highly trained machine learning model capable of providing accurate and consistent optical proximity correction (e.g., assist feature placements) predictions and/or do so at a relatively fast rate for, e.g., a full chip application.

Figure 9A:
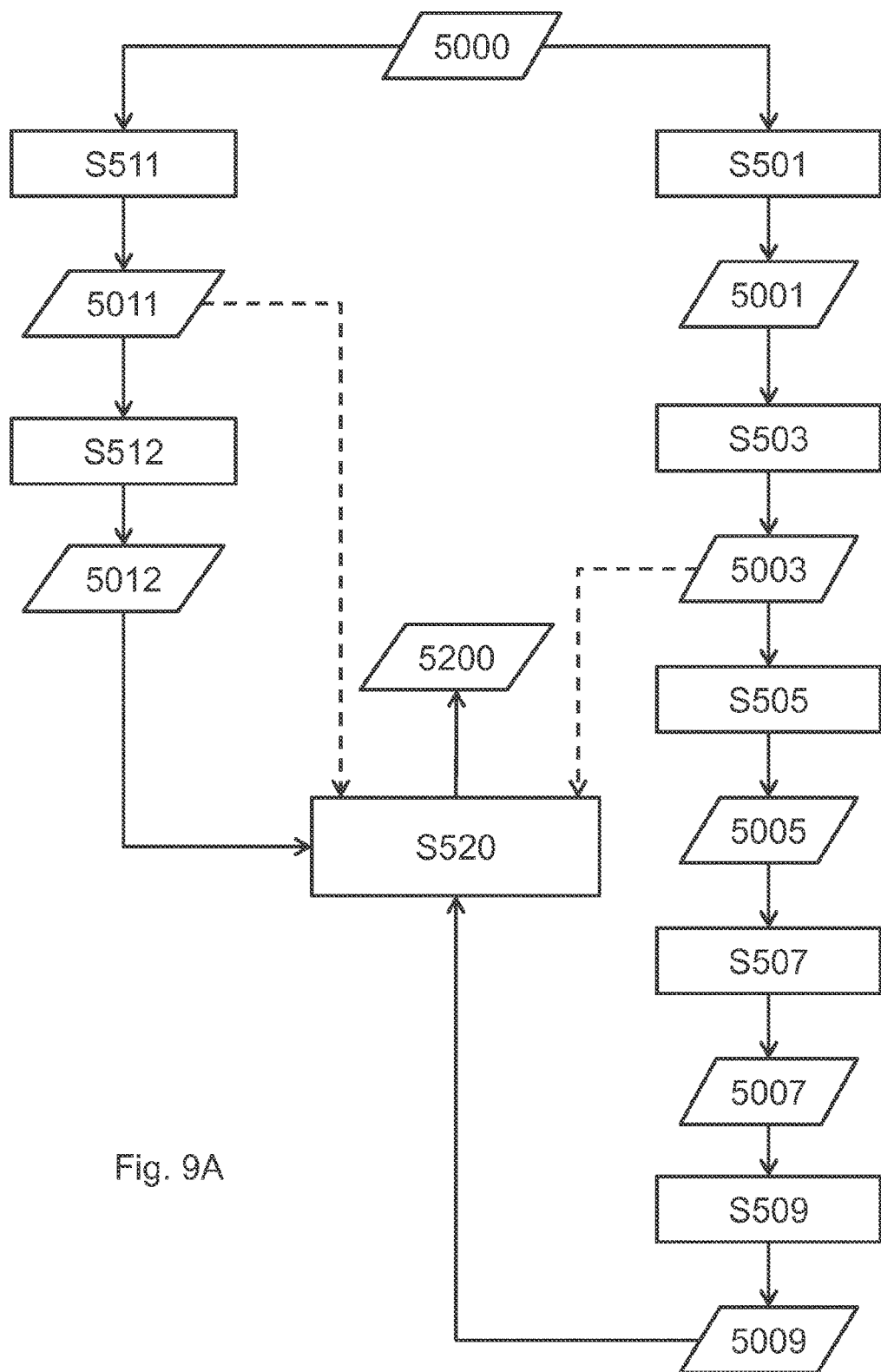
FIG. 9A is a flow chart for a method of training a machine learning model according to an exemplary embodiment of the present disclosure.

FIG. 9A is a flow chart for a method of training a machine learning model according to an exemplary embodiment of the present disclosure. In this method, the training data is supplemented to enable, for example, improved accuracy and consistency of optical proximity corrections. Reference grid dependency is important in computational lithography including optical proximity correction (e.g., assist feature placement) due to reference grid based simulations. This is described above, for example, in respect of FIGS. 4A-4E. So, it is desirable to provide techniques to help reduce the effects of grid dependency and/or improve consistency in view of grid dependency. So, a method is now described that enables training data augmentation to, for example, help improve the consistency and reduce the grid dependency, as so desirably improve the process window of the output of the machine learning model.

The process starts with data 5000 regarding a design pattern as an input to train the machine learning model. In an embodiment, where the machine learning model is being trained to place assist features, the design pattern is a target design pattern or a portion of a design pattern that does not include assist features. In an embodiment, prior OPC may have been done to the design pattern.

In a series of processes, the design pattern 5000 is transformed into optical proximity corrected input images of the design pattern 5000 for the training of the machine learning model. In process S501, the design pattern 5000 is shifted relative to a reference grid in a first direction (e.g., X-axis) and/or a second direction (e.g., Y-axis), for example, as generally illustrated in FIG. 4C by either shifting the design pattern or by shifting the reference grid. In process S501, the design pattern 5000 can be shifted one or more times to generate one or more shifted design patterns 5001. For example, the design pattern 5000 can be shifted in the X and/or Y direction among a series of pixels with a step size of less than the size of a dimension of the pixel (e.g., a shift of less than or equal to 20 nm (where a dimension of the pixel is greater than 20 nm), a shift of less than or equal to 10 nm (where a dimension of the pixel is greater than 10 nm), a shift of less than or equal to 5 nm (where a dimension of the pixel is greater than 5 nm), a shift of less than or equal to 1 nm (where a dimension of the pixel is greater than 1 nm)) to generate shifted design patterns 5001, in which each pattern sits at a different subpixel (in different orientation) with respect to reference grid of pixels. For example, if the shifts are considered shifts between subpixels then each pattern sits on a different subpixel grid. Thus, the subpixels are obtained by, for example, dividing a pixel into smaller units depending on the size of the pixel. For example, for a pixel size of 10 nm×10 nm, a subpixel grid of 10×10 can be formed, where each subpixel size is 1 nm×1 nm. As such, a 10×10 array of the shifted design patterns 5001 can be generated.

In an embodiment, both shifts in the X and Y directions are performed. In an embodiment, the shift size in the X direction need not be the same as the shift size in the Y direction. Further, different combinations of shift sizes may be used for different shifts in a same direction. For example, a first shift in the X or Y direction can be 1 nm and second shift in the X or Y direction can be 2 nm.

In process S503, the shifted design patterns 5001 are processed with optical proximity corrections using, for example, SMO-MO, inverse OPC (iOPC) or other optical proximity technique to generate optical proximity corrected images 5003. In an embodiment, the images 5003 can be CTM maps generated from each of the shifted design patterns 5001. In an embodiment, the technique to generate the CTM maps determines the optical proximity corrections based on edge placement error (EPE) and involves numerous iterations until convergence. So, while the processing time can be relatively long, CTM maps can be quite accurate. And so, it can be useful to use CTM maps of clips for training a machine learning model but not so desirable to use a CTM map for full chip OPC using, e.g., SMO-MO.

In process S505, the images 5003 are analyzed to determine and select one or more images 5005 having an above average process window. The process window can be determined using techniques and tools known in the art such as ASML's Tachyon and/or LMC products and are described in documents incorporated by reference herein. An above average process window can be the best process window of the images 5003. An above average process window can be a process window within 20% of the best process window. The quality of the process window can be evaluated using a metric representing the process window, e.g., the area under two or more process parameters within which one or more pattern features meet a criteria. In an embodiment, the metric can be size of the range of one or more of the parameters of the process window within which one or more pattern features meet a criteria (e.g., the focus range for a dose-focus process window).

In process S507, one or more orientation operations can be performed on the selected images 5005 to generate one or more oriented images 5007. For example, the selected images 5005 can be rotated (e.g., an angle selected from 0 to 360° that is multiple of 45° or 90°), flipped (e.g., mirrored), or both rotated and flipped to generate one or more oriented images 5007. In an embodiment, the type of the orientation operation can be based on the symmetry of a shape of the illumination used in the lithography apparatus. For example, for an annular shaped illumination both rotate and mirror operations can be performed. For a dipole shaped illumination, only a flip operation may be performed. Further, the angle of the orientation operation can depend on the symmetry of the illumination. For example, a dipole with poles aligned on the X axis can be flipped or mirrored across the X and/or Y axes. As another example, a dipole with poles aligned on a 45° line to the X axis can be flipped or mirrored across that line or a line perpendicular that line running through a central portion between the poles of the dipoles.

In process S509, the oriented images 5007 can be further shifted in the X and/or Y directions in a similar manner as discussed in process S501 to generate images 5009. In an embodiment, the same shifts as applied in process S501 are applied to images 5007 to generate images 5009.

In another series of processes, the design pattern 5000 itself is transformed into input images of the design pattern 5000 corresponding to each of the images 5009 for use in training of the machine learning model. For example, each image in 5009 has a corresponding image in 5012, which is generated from the same operations. For example, if image A in 5009 is generated by rotation of 90° and shift by dx and dy, then similar rotation and shift operations are applied on original input image of the design pattern to form image B. In process S511, the design pattern 5000 can optionally be rendered to generate rendered design pattern 5011. For example, the rendered design pattern 5011 can be a gray scale image of the binarized design pattern 500. In process S512, the pattern 5000 or pattern 5011 can be flipped and/or rotated, similar to the process S507, and shifted in the X and/or Y directions, similar to that in process S509, to generate shifted input design patterns 5012. In an embodiment, the same shifts as applied in process S501 are applied to the pattern 5000 or pattern 5011 to generate patterns 5012. In an embodiment, the same flips and/or rotations as applied in process S512 are applied to the pattern 5000 or pattern 5011 to generate patterns 5012.

In process S520, the patterns 5012 and images 5009 (e.g., where there exist an image pair between each of the patterns 5012 with each of images 5009) are used to train the machine learning model and generate a trained machine learning model 5200. The training process can be iterative and may take several training data points to build the trained machine learning model 5200. As will be appreciated, these techniques could be applied to various design patterns to provide a plurality of combinations of patterns 5012 and images 5009 for different input design patterns 5000. In an embodiment, as shown by the dashed lines, the patterns 5011 and images 5003 can be used to train the machine learning model and generate a trained machine learning model 5200. While the discussion above has focused on patterns and images, the manipulated data and resulting training data can be more general data, such as one or more characteristics of the patterns 5012 and one or more characteristics of the images 5009. Once trained with this data, the trained machine learning model 5200 can then be used to generate a predicted optical proximity correction (e.g., assist features placement) from any input design pattern, as illustrated in FIG. 6.

The machine learning model training processes discussed herein involve evaluation of one or more objective functions, e.g., one or more cost/loss functions that minimize the difference between "truth" data and machine learning model predicted data. Such objective functions can be based on the evaluation of one or more certain metrics such as an error in the difference between two sets of data.

Figure 9B:
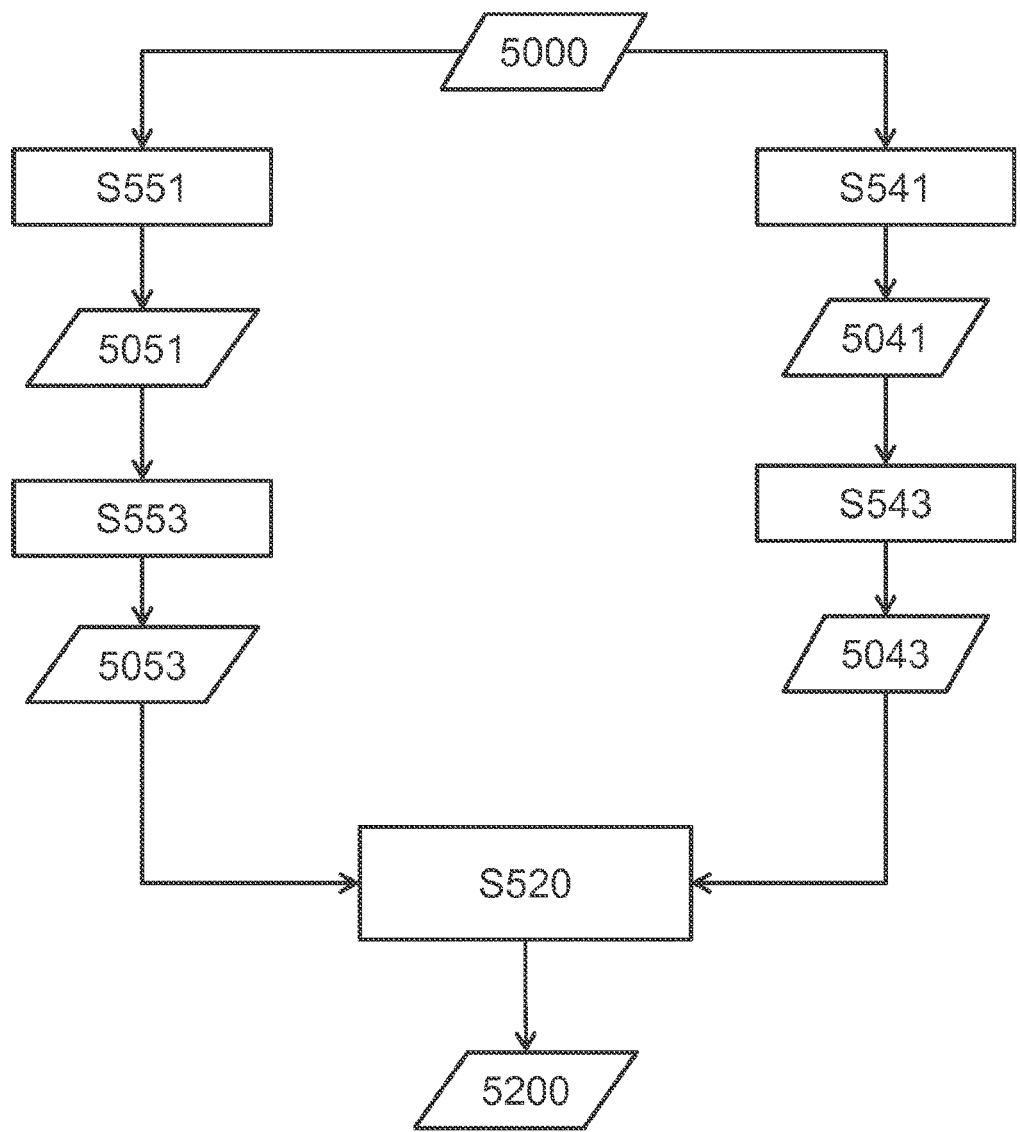
FIG. 9B is a flow chart for adjusting one or more of the machine learning model parameters based on a cost function according to an exemplary embodiment of the present disclosure.

Some of these other evaluation metrics will now be discussed, initially in relation to FIG. 9B. FIG. 9B is a flow chart for a method of updating the machine learning model parameters based on an objective function. It can be implemented in conjunction with, or part of, process S520 of FIG. 9A. The process starts by obtaining a design pattern such as a design pattern 5000. In process S541, the machine learning model generates predicted optical proximity correction data 5041 for the design pattern 5000 (or, e.g., patterns 5011 or 5012). In an embodiment, predicted data 5041 comprises, for example, a predicted CTM map or other image representation of the optical proximity correction (e.g., placement of assist features).

In process S551, benchmark data 5051 is obtained (e.g., generated using, for example, a SMO-MO or iOPC technique) for the design pattern 5000. For example, this data can be, for example, patterns 5003 or 5009 or data 7005 in FIG. 5 or data 9021-9024 in FIG. 7.

In process S543 and/or process S553, the predicted data 5041 and/or the benchmark data 5051 are further processed to generate modified predicted data 5043 and/or modified benchmark data 5053, respectively. Some examples of the processing of process S543 and/or process S553 are described further below in relation to FIGS. 10-15.

In process S520, benchmark data 5051 or modified benchmark data 5053 (generally benchmark data in the following paragraphs) can be evaluated with predicted data 5041 or modified predicted data 5043 (generally predicted data in the following paragraphs) as part of an objective function by which the parameters of the machine learning model can be modified. For example, the objective function can be evaluated using a difference between the benchmark data 5051 or modified benchmark data 5053 and the predicted data 5041 or modified predicted data 5043. As will be appreciated, benchmark data 5051 can be evaluated with predicted data 5041, or benchmark data 5051 can be evaluated with modified predicted data 5043, or modified benchmark data 5053 can be evaluated with predicted data 5041, or modified benchmark data 5053 can be evaluated with modified predicted data 5043 as appropriate the metric, the data, etc. In an embodiment, transformation may be performed on benchmark data and the same transformation is performed on the predicted data and then the difference between the transformed benchmark data and correspondingly transformed predicted data may be obtained.

Figure 10:
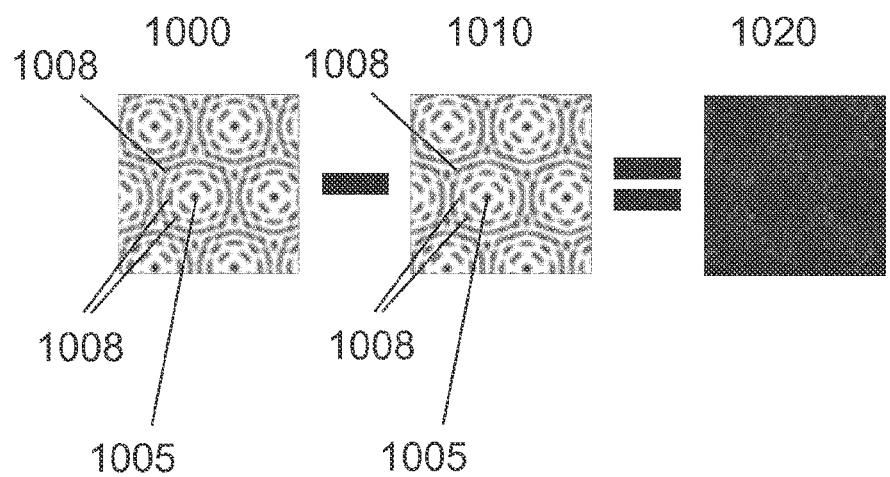
FIG. 10 illustrates an example result of a cost function based on a mean squared error (MSE) according to an exemplary embodiment of the present disclosure.

In an embodiment, a mean squared error (MSE) or mean of x-degree error (MXE), where x can be greater than 2 (e.g., a 4 degree error means the error to the $4^{th}$ power) metric can be used in an objective function that assigns equal importance (e.g., weight) to all the data, e.g., all the pixels of the benchmark data and the predicted data. As such, referring to FIG. 10, a main feature 1005 (e.g., a contact hole) and assist features 1008 are illustrated in FIG. 10 (and FIG. 11). In FIG. 10, a difference between benchmark data 1000 and machine learning model predicted data 1010 is computed as represented by, e.g., a difference 1020. In this example of FIG. 10, if the difference between the benchmark and predicted is greater than zero, a bright spot (e.g., a pixel with value 1 or greater) appears in the image; on the other hand, when the difference is zero, a dark spot (e.g., a pixel with value 0) appears in the image. Accordingly, the MSE or MXE metric can be used on the computed difference and evaluated in a cost or loss function so as to adjust the machine learning model parameters to minimize the MSE or MXE. For example, in the example of FIG. 10, the machine learning model parameters can be modified such that the difference image 1020 has a reduced amount of bright spots as compared to as depicted in FIG. 10 so that there is a nearly entirely dark region. This would indicate a strong match between the predicted data 1010 and the benchmark data 1000. As will be discussed further, additional or alternative evaluation metrics can be beneficial and yield better results from the trained model than MSE or MXE.

In an embodiment, the processing of the predicted data and the benchmark 5051 can involve assigning a higher importance (e.g., weight) to data associated with a certain optical proximity correction in the predicted data and/or benchmark data than to other data in the predicted data and/or benchmark data. For example, a higher weight can be assigned to certain placed assist features in the predicted data and/or benchmark data.

Figure 11:
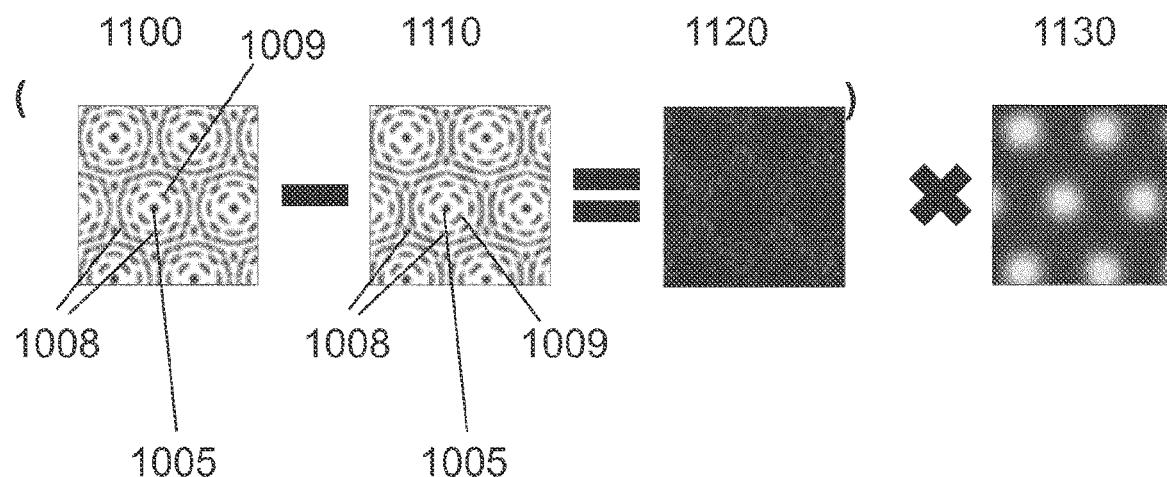
FIG. 11 illustrates an example result of a cost function based on a weighted mean squared error according to an exemplary embodiment of the present disclosure.

In an embodiment, referring to FIG. 11, the objective function can evaluate a weighted error metric (e.g., weighted MSE/MXE) in which different weights can be assigned to different data (e.g., pixels) in the predicted data and/or benchmark data. For example, a relatively higher weight can be assigned to data associated with a certain optical proximity correction (e.g., assist feature) region, i.e., a region where the higher weighted optical proximity correction is located. In an embodiment, that region can be the region nearest to the main feature that at least encompasses one or more optical proximity corrections (e.g., assist features) nearest to the main feature. In a further example, a relatively higher weight can be assigned to parts (e.g., pixels) on the edge of the optical proximity correction. For example, the edge of a scattering bar can be higher weighted than an interior of the scattering bar (and optionally than other parts of the design pattern). In a further example, a weight can be assigned based on a decaying function, where the weight decreases as the distance from the main feature increases. So, for example, pixels nearer the main feature would have a greater weight than those further away from the main feature.

In FIG. 11, a difference between the benchmark data 1100 and the predicted data 1110 generates a difference 1120. In an embodiment, the benchmark data 1100 (e.g., using process S553), the predicted data 1110 (e.g., using process S543) and/or the difference 1120 is combined with a weight according to a map (e.g., of the edges of optical proximity corrections), function (e.g., the decaying function described above), data set (e.g., positions of edge or regions of the design pattern), etc, 1130. In the example of FIG. 11, the weight is multiplied with the difference 1120. Further, in the example of FIG. 11, the weight 1130 is in the form of a weight map, where the weight map assigns a higher weight to pixels close to the main feature (bright spots in the image 1130) and lower (e.g., gradually decreasing) weights to the pixels away from the main feature which is illustrated as a relatively darker shade extending from the bright spots. In this example of FIG. 11, the weight map 1130 assigns a relatively higher weight with a certain optical proximity correction 1009 compared to other regions, including a region having further optical proximity correction 1008. So, in this case, a preference is given to a certain optical proximity correction (e.g., a ring of assist features) 1009 than one or more other optical proximity corrections (e.g., one or more further rings of assist features) 1008.

In an embodiment, the processing of the predicted data and benchmark data can involve transforming the predicted data in image or pixel form and/or the benchmark data in image or pixel form, using binarization function such as a logistic function and a metric of the objective function uses that processed predicted and/or benchmark data. In an embodiment, binarization function can be any function that converts/transforms an image into semi-binary (i.e., pixels having values between 0 and 1) or a binary image (i.e., pixels having values 0 or 1) via functional transformation, where the function is, for example, a logistic function. In an embodiment, upon applying the binarization function to an image, the pixel values of the semi-binary may be very close to 0 or 1 (e.g., within less than 10% of the extreme values 0 or 1). For example, the pixel values very close to 0 can be 0, 0.01, 0.05, etc. and values very close to 1 can be 0.9, 0.95, 1, etc. Accordingly, the present disclosure is not limited on only binary image.

In an embodiment, the logistic function can be of the form of:

$$\frac{L}{1+e^{-k(x-x0)}} \quad (1)$$

wherein L is the curve's maximum value, k is the steepness of the curve and x0 is a threshold value (e.g., a midpoint of x). In an embodiment, the logistic function is a sigmoid function (i.e., where k=1, x0=0, and L=1).

Figure 12A:
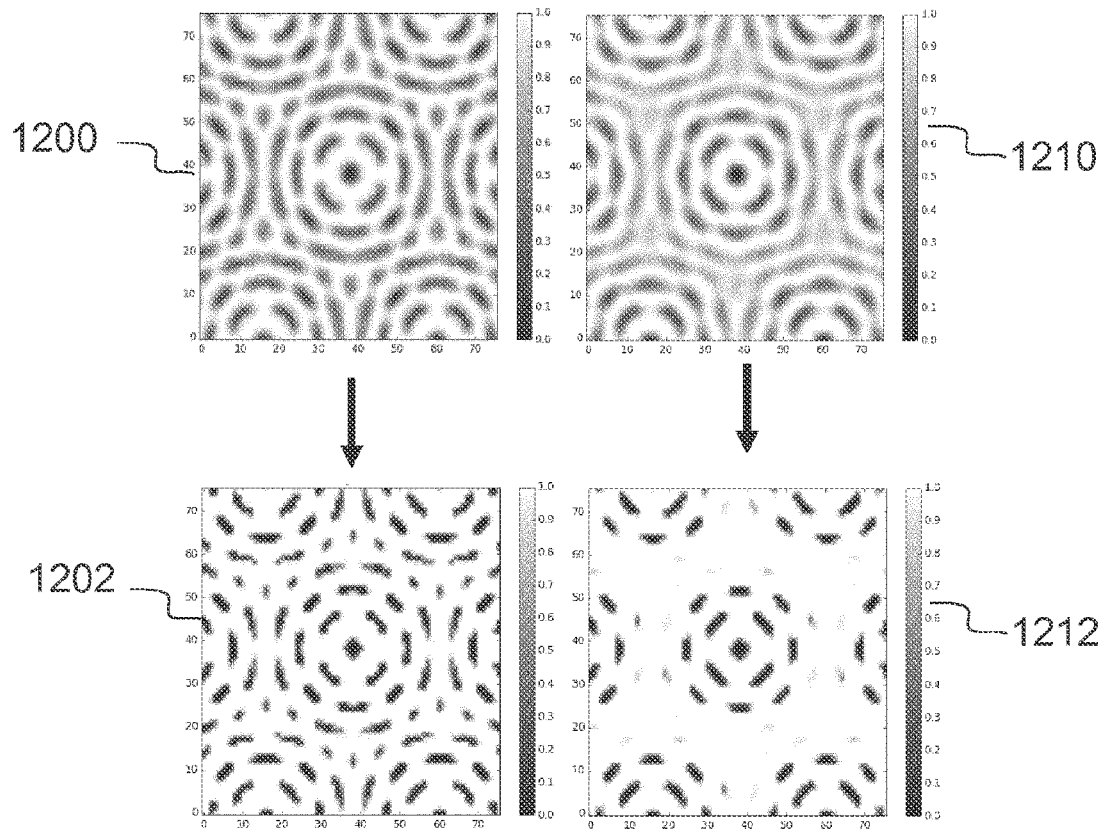
FIG. 12A illustrates an example output of a binarization technique according to an exemplary embodiment of the present disclosure.

Referring to FIG. 12A, the objective function can be based on a metric that used a binarized version of predicted and/or benchmark data using a logistic function. That is, in an embodiment, a logistic function such as a sigmoid function is used to convert (e.g., process S543 and/or process S553 as applicable) using a gray-scale image of the predicted and/or benchmark data to a binary image. For example, benchmark data image 1200 is converted to a benchmark binary data image 1202, and a predicted data image 1210 is converted to a binary predicted data image 1212.

In this binarization technique, the location of an optical proximity correction (e.g., an assist feature) is more important than its intensity. In other words, SRAF maps (e.g., 1200 or 1210) act as guide for placing SRAF polygons around the main features. Placing SRAF polygons is based on shape (e.g., peak values) information of SRAF maps. Thus, even if the ML predicted map (e.g., 1210) has lower intensity than the benchmark map (e.g., 1200), but the shape information is available, the same SRAF polygons (e.g., as available in the benchmark map) can be placed around the main features.

In an embodiment, the binarization may be a single step process (e.g., apply equation 1) or a two-step process (e.g., apply equation 1 and further threshold based binary conversion). For example, in an embodiment, to enable the binarization, a threshold value may be assigned to the result of logistic function based transformation. For example, in the case of a sigmoid function, the threshold can be approximately greater than 0.5 which indicates that after sigmoid transformation a pixel of the resulting image having a value approximately greater than 0.5 is assigned a value 1, otherwise the pixel is assigned a value 0. Where a logistic function is used, the binary "1" can be assigned to those input values with its logistic function value greater than the logistic function value at X0 and the binary "0" can be assigned to those input values with its logistic function value less than the logistic value at X0.

In an embodiment, related to binary cost, different ways to convert a gray-scale image to a binary or semi-binary image may be employed. For example, using a fixed threshold, i.e., a step function, to binarize a gray-scale image. Or a sigmoid function to convert it to a semi-binary image. In an embodiment, binarization may be a one step process e.g., via sigmoid transformation.

In an embodiment, the binarization can be used with any objective function metric such as MSE, MXE, RMS, etc. In an embodiment, the binarization can be used in conjunction with a regular MSE/MXE cost function as a fine tuning process to further improve a baseline model trained using a regular MSE/MXE cost function.

Figure 12B:
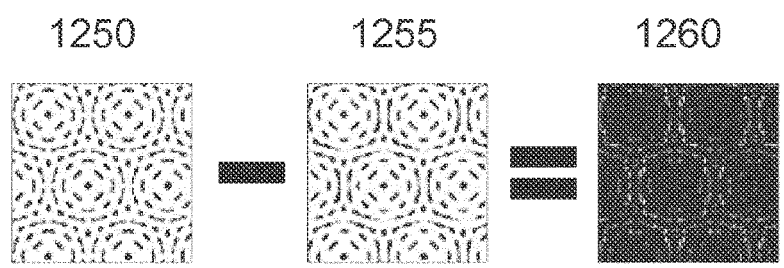
FIG. 12B illustrates an example result of a cost function based on a binarization technique according to an exemplary embodiment of the present disclosure.

FIG. 12B illustrates the result of a cost function using binarized benchmark and predicted data. A difference between binarized benchmark data 1250 and binarized predicted data 1255 is computed. The result is a difference 1260, as illustrated. So, based on the evaluation of a metric of an objective function using the binarized benchmark data 1250 and binarized predicted data 1255, the machine learning model parameters can be modified. For example, in an embodiment, a cost or loss function using a metric such as RMS, MSE, or MXE can reduce the difference 1260 by adjusting one or more parameters of the machine learning model through a minimization process of the cost or loss function.

In an embodiment, the processing of the predicted data and the benchmark data can involve identifying an edge of each of one or more optical proximity corrections in image data making up at least in part the benchmark and/or predicted data. Furthermore, in an embodiment, a higher importance (e.g., weight) can be assigned to the one or more identified edges of the predicted and/or benchmark data than another part of the optical proximity correction(s) and/or to other parts of the design pattern.

Figure 13:
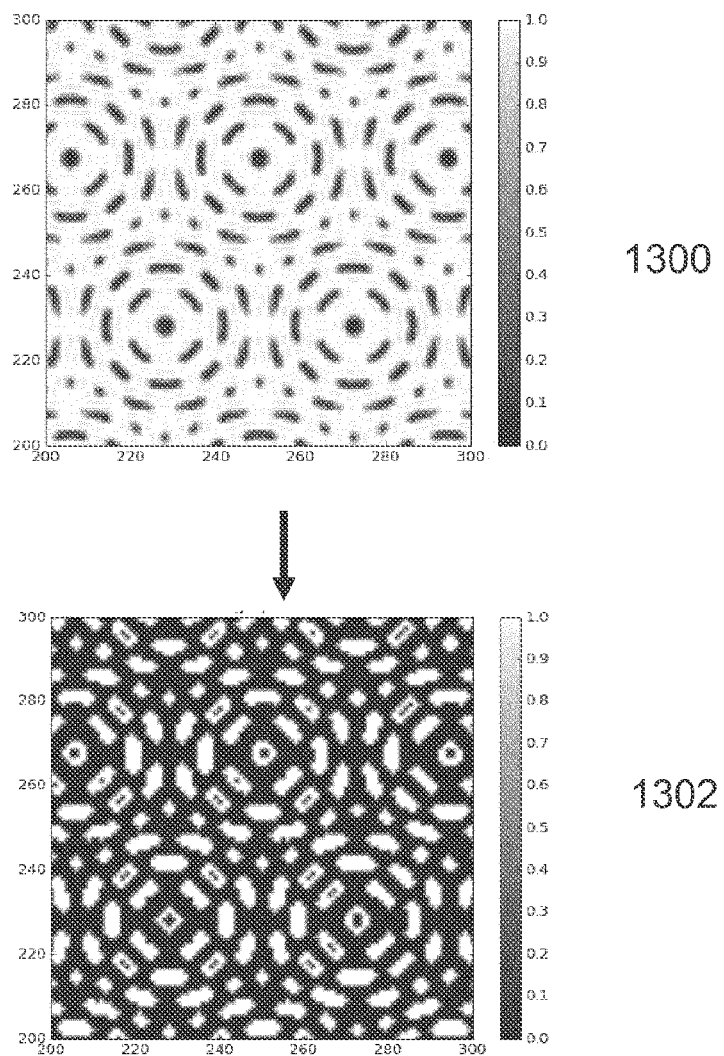
FIG. 13 illustrates an example output of an edge pixel enhancement technique according to an exemplary embodiment of the present disclosure.

In an embodiment, referring to FIG. 13, the objective function can use an edge pixel enhancement technique according to the present disclosure. In the edge pixel enhancement technique, edge pixels of the one or more main features and/or the one or more optical proximity corrections are identified so as to e.g., effectively transform (e.g., using process S553 and/or S543) an original image 1300 to a modified image 1302 used for training of the machine learning model. In the edge pixel enhancement technique, for every pixel within the original image 1300, if a pixel has different signs (relative to a threshold, for example, a numerical value of at least 0.5 if pixel intensity is in [0, 1]) with respect to its four neighbors (up, down, left, right), then the pixel is considered as an edge pixel. In an embodiment, the edge pixel identification involves evaluation of a gradient with respect to a pixel in association with various adjacent directions. Once the edge pixels are identified, a different importance can be applied to edge pixels than other parts of the image. For example, a higher weight can be applied to the edge pixels of the main feature and/or optical proximity correction than an interior thereof. In an embodiment, a higher weight can be applied to the edge pixels of the main feature and/or optical proximity correction than all other parts. The modified image 1302 and/or the weighted image 1302 can then be used with an evaluation metric (e.g., MSE, MXE, RMS, etc.) of an objective function as part of the training of the machine learning model. In an embodiment, spatial evaluations of the objective function are based on the edge pixel information exclusively. In an embodiment, the edge pixel enhancement technique can be used as a fine tune technique to further improve a baseline model trained using another (e.g., MSE/MXE) cost function.

In an embodiment, the processing of the predicted data and the benchmark data can involve enhancement of edge points of the one or more main features and/or the one or more optical proximity corrections in image data making up at least in part the benchmark and/or predicted data. The image data with enhanced edge points can then be used in evaluating an objective function of machine learning model training method.

Figure 14:
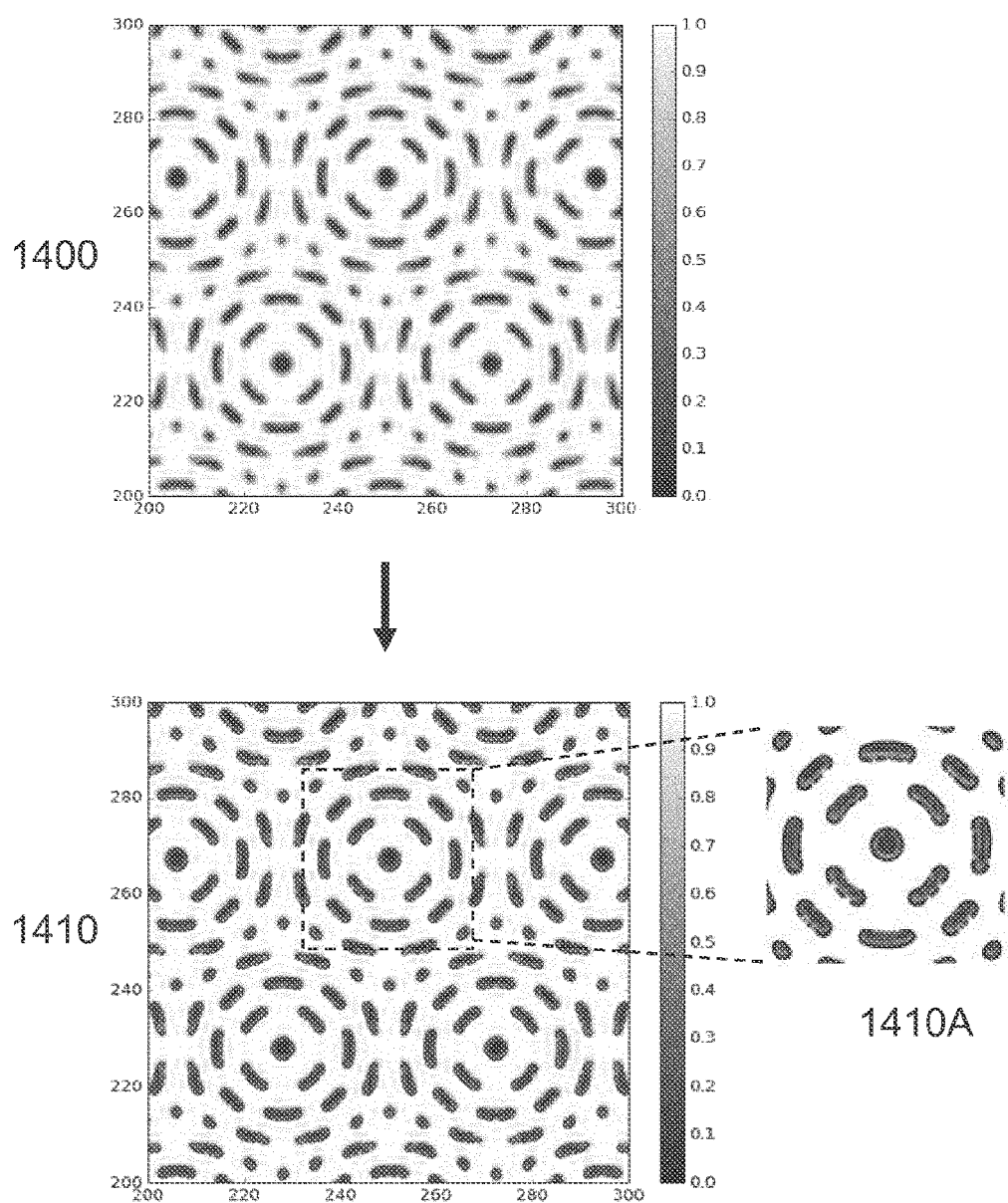
FIG. 14 illustrates an example output of an edge point enhancement technique according to an exemplary embodiment of the present disclosure.

In an embodiment, referring to FIG. 14, the objective function can use an edge point enhancement technique according to the present disclosure. In the edge point enhancement technique, a contour is traced (or extracted) along the edge of the one or more main features from a benchmark image and/or the one or more optical proximity corrections of the benchmark and/or predicted data. In an embodiment, a threshold value may be used to trace the contours (e.g., a pixel value between 0 and 1 such as threshold of 0.5). The contour traces edge points of the one or more main features and/or the one or more optical proximity corrections. The contour includes several points (also referred to as gauge points), each gauge point has an intensity value (e.g., between 0 and 1). These edge points act as gauges in ML training process. In a training stage, ML model predicts an image, then an intensity value at a gauge point location of the image is determined. For example, an interpolation method may be used to determine intensity values at gauge locations. Then, a cost function is evaluated by comparing the predicted intensity value (of the predicted image) with a truth value, i.e., the threshold.

In an embodiment, the edge point enhancement technique involves converting an image (e.g., gray-scale image) of benchmark and/or predicted data to contours (e.g., GDSII, OASIS or other format) of the one or more main features and/or the one or more optical proximity corrections using any contour identification technique. For example, a contour identification technique can involve identifying the edge and applying a threshold to identify the contour (e.g., evaluating gray-scale values along lines perpendicular to the edge and running through the edge to identify where a gray-scale value passes a certain threshold to identify that as a contour location). In an embodiment, the contour identification technique can evaluate a gradient at points along the edge to extract a contour. In an embodiment, the image can be upscaled to a finer pixel grid for the purpose of contour identification. In an embodiment, the image can have binary pixels, e.g., a binarized version obtained using a technique as described herein. In an embodiment, the one or more contours are extracted from the image data of the benchmark data and the prediction data and used in the objective function evaluation.

With the one or more contours identified, a number of points (e.g., 2 or more, 5 or more, 10 or more, 20 or more, 40 or more, 50 or more, 100 or more, which can be per contour or for a design pattern as whole) can be selected from one or more contours of the one or more main features and/or the one or more optical proximity corrections, which contour points will be used in the objective function evaluation as part of the machine learning model training. That is, the machine learning training will be enforced to fit the machine learning model well at those contour points for which the target image value is known to be equal to threshold (i.e., the benchmark data and predicted data should match well at those locations on the contour). Thus, by focusing on evaluation of the contour points, a higher importance is given to, in particular, the edges of optical proximity corrections. For example, emphasis (higher importance) may be placed on SRAFs by selecting only SRAF edge points/pixels, emphasis (higher importance) may be placed on main features by selecting only main feature edge points/pixels, or a combination thereof. So, in an embodiment, spatial evaluations of the objective function are based on the contour locations exclusively. Now, where applicable, one or more of the selected points may be off the reference pixel grid (i.e., effectively at a subpixel) of the image so a local interpolation function or operator can be used to compute an image value corresponding to those one or more selected points using on grid data from the image. Then, the image values at the selected points (whether calculated by interpolation or not) can be used in any evaluation metric (e.g., MSE, MXE, etc.) of the objective function of the training process of the machine learning model. In an embodiment, the selected edge points of one or more optical proximity corrections may be further assigned a higher weight than other parts of the associated optical proximity corrections and/or of other parts of the design pattern using, for example, techniques described in respect of FIG. 11. In an embodiment, the edge point enhancement technique can be used as a fine tune technique to further improve a baseline model trained using another (e.g., MSE/MXE) cost function. In an embodiment, another metric (e.g., MSE, MXE) (as regularization) and an edge point based metric (e.g. edge point MSE/MXE) are combined into one objective function.

The edge point enhancement technique involves tracing contours of features (e.g., main feature and SRAFs) from an image and using contour points (i.e., points along the contour of a feature) as training data (or training gauge points). For example, in image 1400, contours of features are traced and contour points are super imposed along the contours, as illustrated in image 1410 (or enlarged portion 1410A of 1410).

Figure 15:
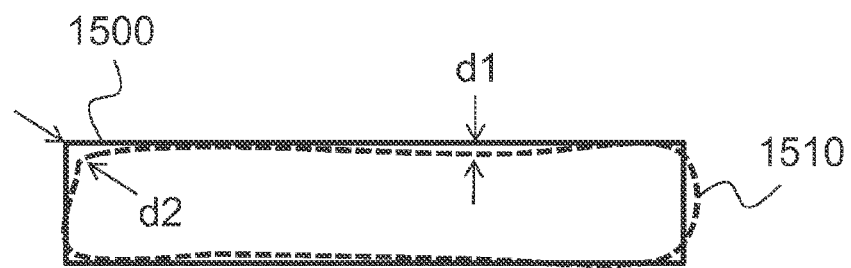
FIG. 15 illustrates an example output illustrating edge placement error according to an exemplary embodiment of the present disclosure.

In an embodiment, contours from benchmark and predicted data can be used in an edge placement error manner as a basis for generating data for evaluation of a metric of a machine learning model training process. That is, in an embodiment, an edge placement error can be determined between a benchmark data contour and a predicted data contour, which edge placement error can be used in an evaluation metric (e.g., MSE, MXE) of the objective function. FIG. 15 illustrates a highly schematic example of such edge placement error used in evaluating an objective function of a machine learning process according to an exemplary embodiment. In FIG. 15, the contour of a pattern 1500 from the benchmark data is depicted (in this case, shown as a rectangular polygon for convenience but could be quite curved) along with a contour of a pattern 1510 from the predicted data (determined by the machine learning model). In an embodiment, the pattern 1500 and pattern 1510 correspond to an optical proximity correction (e.g., an assist feature). As shown, at certain parts of the edges of the pattern 1500 and the pattern 1510 are offset, for example, by distance d1 and d2. The objective function can be the distances d1 and d2 (and other edge placement error distances) in evaluating a metric of an objective function (e.g., in minimizing an MSE/MXE metric of a cost function) to effectively reduce at least one or more of the offsets (if not to eliminate all the offsets) through adjustment of one or more machine learning model parameters.

In an embodiment, an objective function of the machine learning model can have a penalty term to help improve consistency and symmetry of predictions by the machine learning model. In particular, a penalty term like the form of $D(f(I), S^{-1}(f(S(I))))$ can be added to the objective function (and evaluated as part of the evaluation of the objective function) to help improve consistency. In this example, function f corresponds to the prediction of an input image I using the machine learning model. The image I is shifted from an initial position of the image I by a shift function S to generate a shifted image S(I). The shifted image S(I) can be input to the machine learning model to generate a predicted shifted input image f(S(I)). The predicted shifted input image f(S(I)) can then be inversely shifted (i.e., shifted back) by an inverse shift function $S^{-1}$ of S to generate an inverse shifted predicted image $S^{-1}(f(S(I)))$, thus effectively shifting back the shifted image to the initial position. Further, the input image I can be directly input to the machine learning model without shifting to generate a predicted image f(I). Then, the inverse shifted predicted image $S^{-1}(f(S(I)))$ and the predicted image f(I) can be evaluated using a comparison function D. For example, the function D can be a distance function to identify the distance between the two predictions, e.g., to find a difference. In an embodiment, the penalty term $D(f(I), S^{-1}(f(S(I))))$ is minimized, e.g., towards zero, to help improve consistency and symmetry. The shift function S is used as an example, and does not limit the scope of the invention. In an embodiment, other image operation may also be performed alone or in combination such rotation, flipping, etc. Accordingly, the shift function may include shift, rotation, flip, other operations, or a combination thereof.

In an embodiment, the various techniques described herein can be combined in any appropriate combinations and one or more aspects of one technique can be incorporated into or substituted for one or more aspects of another technique. For example, a particular objective function can incorporate a combination of metrics described herein or use a combination of techniques to generate data for evaluation of the objective function. Or, as another example, a plurality of objective functions can be used to incorporate different metrics or use data processed by different techniques for evaluation of the objective function.

So, the training process of the machine learning model and associated objective function techniques, according to the present disclosure, can have one or more advantages. As noted above, one or more of the techniques described herein can enable more consistent predictions, enable improved accuracy and/or enable quicker optical proximity correction predictions for large patterns. Additionally or alternatively, the machine learning training and use can advantageously use gray-scale images as input and/or output. As ML input, a gray-scale representation can contain much more information than traditional binary representation if given the same grid resolution. For example, as ML output, CTM images used to train a machine learning model can include relatively more information than a binary pattern for a given grid resolution. Additionally or alternatively, when model-based optical proximity correction techniques are used such as Tachyon SMO or an inverse OPC (iOPC) to generate benchmark data, the machine learning model can be optimized with data that can yield a strong (if not best) process window. As such, the trained machine learning model propagates the process window benefit of model-based optical proximity correction techniques from a clip level to a larger pattern, such as a full chip. Consequently, for example, a trained machine learning model using one or more of the techniques described herein can enable a full chip optical proximity correction with a relatively low runtime and provide a relatively good process window.

Further, in an embodiment, deep learning can be applied to optical proximity correction prediction (e.g., SRAF placement problem). Compared with traditional machine learning techniques, deep learning can, e.g.: 1) require no manual feature engineering, 2) is capable of learning a large amount of data, and/or 3) can have high accuracy.

In an embodiment, the techniques herein can be seamlessly integrated into a full-chip OPC flow, such as an ASML Tachyon OPC flow. For example, a predicted optical proximity correction map (e.g., an assist feature map) can be used to apply the optical proximity corrections on a design pattern (e.g., SRAF extraction) and be subject to further OPC. Additionally, user-defined mask constraints can be applied to application of the optical proximity corrections and/or print check can be made at process conditions (e.g., using ASML's LMC tool).

In an embodiment, the machine learning techniques herein can be extended to other applications in OPC where image prediction is desired, e.g., the initialization of an advanced inverse computational lithography engine.

For optical proximity correction prediction, it is desirable to use a target design pattern (which can be a clip or a full chip) to predict an (optimized) optical proximity correction prediction for that target design pattern. But there are many different options for machine learning input and output. In an embodiment, a target design pattern and an optical proximity corrected design pattern can be typically, for, e.g., manufacturing purposes, in a GDS (GDSII), OASIS or other similar format, which means they are binary. For a machine learning process, an image can be used to predict an image of the optical proximity correction. So, in an embodiment, the binary target design pattern in GDS (GDSII), OASIS or other similar format is converted to a pixelated image. In a first possibility, the target design pattern is converted into a binary pixelated image. In another possibility, the target design pattern is converted into a gray-scale pixelated image. As noted above, it can be desirable to choose the latter option—a gray-scale pixelated image. The reasons for this include, e.g.,: 1) For a same given pixel size (image resolution), a gray-scale image has a significant amount more information than a binary image because of the additional degree of freedom of "continuous" intensity depending on the number of gray levels. In other words, to keep the same amount of information as a binary pixelated image, a gray-scale image can have a larger pixel size than a binary pixelated image and thus can speed up the computation; and/or 2) an advanced mask optimization engine (e.g., an SMO or iOPC software tool such ASML's Tachyon software) can directly provide a CTM image for a given target design pattern, which CTM image is in gray scale.

So, in an embodiment, for the machine learning input image, a mask model can be used to render a binary target design pattern into a gray-scale target design pattern image. For the machine learning output image (including the benchmark data for the machine learning), a CTM image can be used, which can be generated using a CTM generation software program for machine learning model training.

But there can be some other possibilities for the machine learning model input image. For example, a gray-scale target design pattern image can be convolved with one or more optical kernels, for example, one or more TCC kernels, to generate one or more additional signal images. In an embodiment, a single gray-scale target design pattern image can yield more than one signal image because there can be numerous optical kernels (e.g., TCC kernels) in a model. In an embodiment, all the signal images can be used in a machine learning model training or a selection of one or more signal images can be used. As a further example, an output image of a model-based SGM software engine can be used as a machine learning input image. In most cases, such an image is closer to a CTM image than a gray-scale target design pattern image created by a mask model.

The machine learning model then only needs to learn the difference (or error) between them, which can make the task easier. So, to summarize, for machine learning input, there can be several possibilities including 1) a gray-scale target design pattern image, 2) one or more signal images, and/or 3) an SGM. Since machine learning can take in a couple of images with the same size as one input, one or a mix of them can be chosen as the input for the machine learning.

Several neural network structures have been designed for deep learning tasks. As an example, for image recognition tasks, architectures include, for example, AlexNet (see, e.g., A. Krizhevsky et al., "ImageNet Classification with Deep Convolutional Neural Networks", Advances in Neural Information Processing Systems 25 (NIPS 2012), which is incorporated herein in its entirety by reference), GoogLeNet (see, e.g., C. Szegedy et al., "Going Deeper with Convolutions," 2015 IEEE Conference on Computer Vision and Pattern Recognition (CVPR), which is incorporated herein in its entirety by reference), VGG (see, e.g., K. Simonyan et al., "Very Deep Convolutional Networks for Large-Scale Image Recognition", International Conference on Learning Representations (2015), which is incorporated herein in its entirety by reference), and ResNet (see, e.g., K. He et al., "Deep Residual Learning for Image Recognition", 2016 IEEE Conference on Computer Vision and Pattern Recognition (CVPR), which is incorporated herein in its entirety by reference). Each of those designs has its own intuition and strength. However these are not necessarily directly applicable to predicting optical proximity corrections for a design pattern as described herein because optical proximity correction prediction differs significantly from traditional deep learning tasks. For example, a typical image classification problem has fixed input and output size while for optical proximity correction prediction it is desirable to address images with different sizes. As a further example, pooling layers (with stride larger than 1) are often used to provide dimensionality reduction and improve local invariance. However, this tends not to be useful for optical proximity correction prediction since the input and output image pair usually has the same size. So, in an embodiment, there is described hereafter a new neural network as a machine learning model for optical proximity correction prediction.

Figure 16:
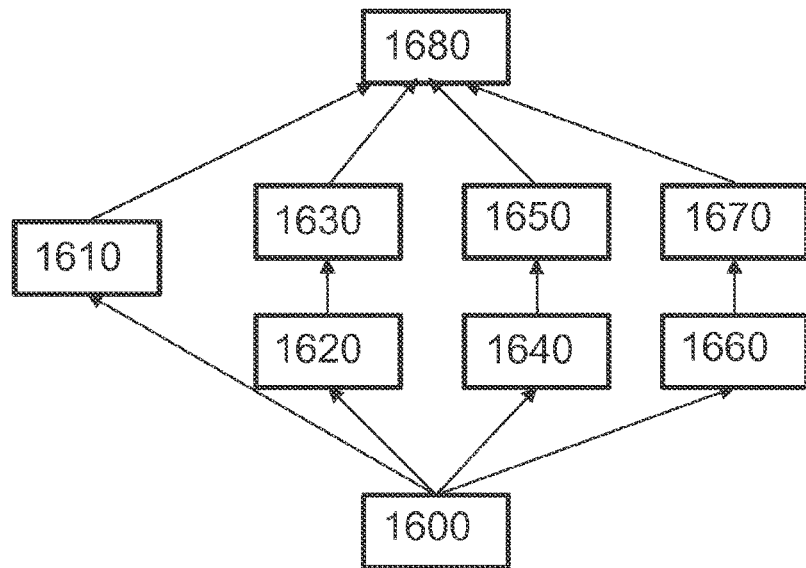
FIG. 16 illustrates an example inception block for a neural network according to an exemplary embodiment of the present disclosure.
Figure 17:
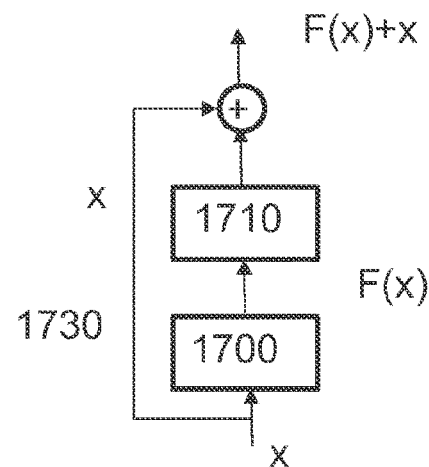
FIG. 17 illustrates an example residual block for a neural network according to an exemplary embodiment of the present disclosure.

In an embodiment of this neural network, there is provided one or more fundamental building blocks and then a deep network is constructed by stacking instances of one or more the fundamental blocks. For the one or more fundamental blocks, there are several options. A first type of fundamental block is a convolutional layer as known in the art. Another type of fundamental block is an inception block. The inception block consists of maximum one pooling layer with a stride of 1 and two or more convolutional layers with different filter sizes. An example inception block is presented in FIG. 16. In FIG. 16, blocks 1610-1650 and 1670 represent convolution layers (e.g., 1×1 convolutions 1610, 1620, 1640, 1670, 3×3 convolutions 1630 and 5×5 convolutions 1650 although different arrangements can be provided). Further, block 1660 represents the one pooling layer (e.g., 3×3 max pooling), block 1680 represents concatenation (e.g., concatenation of output images from layers 1610, 1620, 1650, and 1670) and block 1600 generally refers to a previous layer (such as another inception block). A further type of fundamental block is a residual block. The residual block has two convolutional layers and an additional path to directly connect the input and output of the residual block. An example of a residual block is presented in FIG. 17. Blocks 1700 and 1710 represent the convolution layers, which in this case can generally a function F of input x. Line 1720 represents the additional path to directly connect the input and output of the residual block. In this example, the path connects the input to an adder to combine the value x with F(x) to yield F(x)=F(x)+x. So, to create a deep neural network, one or more instances of one or more of these fundamental blocks are connected. In an embodiment, one type of fundamental block can be used for the whole neural network. In an embodiment, a mix of different fundamental blocks can be used in neural network. An advantage of these fundamental blocks is that they can support flexible input image sizes because essentially only convolution and pooling operations are used. The final deep neural network thus also supports a flexible output image size.

Figure 18:
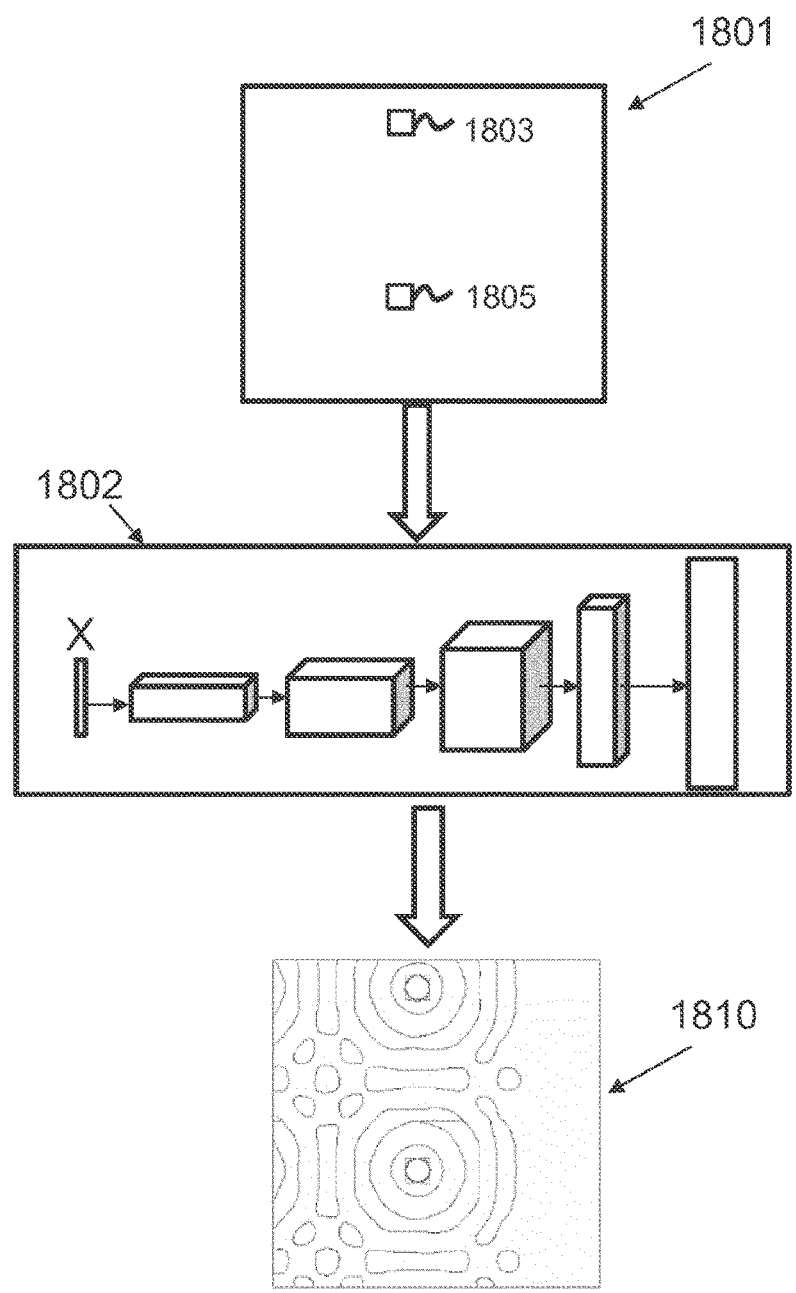
FIG. 18 illustrates an example patterning device pattern generated using an example inverse process model trained as shown in FIG. 3, according to an embodiment.

FIG. 18 illustrates an example optical proximity correction 1810 generated using an example trained machine learning model 1802 (an example of ML models 705, 5200 trained as per the methods of FIGS. 5 and 7 the present disclosure). As shown in FIG. 18, a design target or a wafer target layout 1801 (e.g., including contact holes 1803 and 1805) may be provided as input to a convolutional neural network (CNN) 1802 (an example of the trained model 705, 5200, etc.) resulting in a mask pattern 1810 (e.g., curvilinear pattern) having optical proximity correction including assist features around features corresponding to 1805 and 1805. The CNN 1802 includes several layers, each layer having unique weights, and/or biases determined based on the training process of, for example, FIGS. 5 and 7 using different objective functions (e.g., RMS, MSE, MXE, etc.) as discussed earlier. The input i.e., the wafer target layout 1801 is a pixelated image, each pixel of the pixelated image may be modified according to the convolution operation through each layer to generate the output i.e., the mask pattern 1810 having optical proximity corrections at the last layer. Such generation of the mask pattern 1810 is a single step process, as opposed to an iterative process of, for example, the conventional OPC process.

In an embodiment, there is provided a method comprising: obtaining training data set including an optical proximity correction corresponding to a spatially shifted version of a training design pattern; and training, by a hardware computer system, a machine learning model configured to predict optical proximity corrections for design patterns using data regarding the spatially shifted version of the training design pattern and data based on the optical proximity correction for the spatially shifted version of the training design pattern. In an embodiment, the spatial shift is less than a size of a dimension of a pixel grid of the training design pattern. In an embodiment, the method comprises obtaining the training data set including a plurality of differently spatially shifted versions of the training design pattern and corresponding optical proximity correction for the spatially shifted version of the training design pattern; and training the machine learning model using data regarding the plurality of differently spatially shifted versions of the training design pattern and the corresponding optical proximity correction for the spatially shifted version of the training design pattern. In an embodiment, the method further comprising: selecting at least one of the optical proximity correction out of the plurality of differently spatially shifted versions of optical proximity correction that exhibit a higher than average process window than the other remaining one or more versions of the optical proximity correction within the training data set; and training the machine learning model using data based on the selected one or more of the optical proximity corrections. In an embodiment, the method comprises selecting the optical proximity correction out of the plurality of differently spatially shifted versions of optical proximity correction that exhibits the best process window. In an embodiment, the method further comprising: performing one or more rotation, flipping, or both, operations on the selected optical proximity correction to obtain one or more re-oriented versions of the selected optical proximity correction; and training the machine learning model using data based on the one or more re-oriented versions of the selected optical proximity correction and corresponding one or more re-oriented training design patterns. In an embodiment, the method further comprising: performing one or more spatial shifts of the selected optical proximity correction to obtain one or more differently spatially shifted versions of the selected optical proximity correction; and training the machine learning model using data based on the one or more differently spatially shifted versions of the selected optical proximity correction, and corresponding one or more differently spatially shifted versions of the training design pattern. In an embodiment, the obtaining and training is repeated for a plurality of different design patterns. In an embodiment, the optical proximity corrections comprise a placement of assist features around a main feature of a given design pattern and/or modification to the main feature of the given design pattern. In an embodiment, the optical proximity corrections are in the form of images and the training is based on the images or pixel data of the images. In an embodiment, the images are a gray-scale image rendered from a target design pattern image, and/or a sub-resolution assist feature guidance map (SGM) map, and/or a signal image obtained by convolving of an image of the target design pattern with an optical kernels, and/or continuous transmission mask, and/or an output image of a model-based SGM processing of the target design pattern.

In an embodiment, there is provided a method comprising: obtaining one or more spatially shifted versions of a design pattern and corresponding spatially shifted version of optical proximity correction image for each of the one or more shifted design patterns; selecting, by a hardware computer system, one or more optical proximity correction images of the one or more shifted design patterns having a process window metric meeting or passing a threshold; and training, by the hardware computer system, a machine learning model using training data comprising data regarding one or more spatially shifted versions of the design pattern and data regarding the selected one or more optical proximity correction images.

In an embodiment, the method further comprises reorienting the selected one or more optical proximity correction images to generated re-oriented one or more optical proximity correction images; spatially shifting the re-oriented one or more optical proximity correction images to generate a plurality of differently shifted re-oriented one or more optical proximity correction images; obtaining a plurality of differently shifted versions of the design pattern corresponding to the plurality of differently shifted re-oriented one or more optical proximity correction images; and training the machine learning model using training data comprising data regarding the plurality of differently shifted re-oriented one or more optical proximity correction images and data regarding the plurality of differently shifted versions of the design pattern. In an embodiment, reorienting comprises one or more selected from: a flipping operation, a rotating operation, and/or a mirroring operation, wherein the type of operation is based on an illumination shape of a lithography apparatus. In an embodiment, the optical proximity correction image is a continuous transmission mask image.

In an embodiment, there is provided a method comprising: obtaining a weighting function or data to assign a different weight to a region of an optical proximity correction of a design pattern than another region thereof; and training, by a hardware computer system, a machine learning model configured to predict optical proximity corrections for design patterns by evaluating a predicted optical proximity correction of the design pattern by the machine learning model against a benchmark optical proximity correction of the design pattern based on the weighting data.

In an embodiment, the weighting function or data is applied to the predicted optical proximity correction, the benchmark optical proximity correction, and/or a difference between predicted and benchmark optical proximity corrections. In an embodiment, the weighting function or data assigns a higher weight to a region adjacent to a main feature of the design pattern than a region outside of that region. In an embodiment, the region encompasses an optical proximity correction for the main feature but excludes another optical proximity correction for the main feature. In an embodiment, the weighting function or data assigns a higher weight to an edge of an optical proximity correction than an interior of the optical proximity correction and/or of another part of the design pattern. In an embodiment, the weighting function or data comprise a weighting function configured to decay the weight as a function of distance from a main feature of the design pattern.

In an embodiment, there is provided a method comprising: obtaining a benchmark optical proximity correction for a design pattern; generating, by a hardware computer system, a predicted optical proximity correction for the design pattern using a machine learning model; assigning, by the hardware computer system, a relatively high weight at a portion of the predicted and/or benchmark optical proximity correction; and training, by the hardware computer system, the machine learning model using an objective function evaluating the weighted predicted and/or benchmark optical proximity corrections.

In an embodiment, the relatively high weight is assigned at an edge of the optical proximity correction. In an embodiment, a different weight is assigned to a first optical proximity correction for a main feature of the design pattern than a second optical proximity correction for the main feature.

In an embodiment, there is provided a method comprising: applying, by a hardware computer system, a binarization function to image data of a predicted optical proximity correction of a design pattern by a machine learning model and/or a benchmark optical proximity correction of the design pattern to produce a respective binarized version thereof; and training, by a hardware computer system, a machine learning model configured to predict optical proximity corrections for design patterns by evaluating the predicted optical proximity correction against the benchmark optical proximity correction based on the binarized version of the predicted and/or benchmark optical proximity correction.

In an embodiment, the binarization function is a sigmoid function.

In an embodiment, there is provided a method comprising: obtaining a benchmark optical proximity correction image for a design pattern; generating, by a hardware computer system, a predicted optical proximity correction image for the design pattern using a machine learning model; transforming, by the hardware computer system, the predicted and benchmark optical proximity correction images using a binarization function into respective binary images; evaluating, by the hardware computer system, data of the binary image of benchmark optical proximity correction image against data of the binary image of the predicted optical proximity correction image; and adjusting, by the hardware computer system, a parameter of the machine learning model based on the evaluation.

In an embodiment, the binarization function is a sigmoid function.

In an embodiment, there is provided a method comprising: processing, by a hardware computer system, image data of a predicted optical proximity correction of a design pattern by a machine learning model and/or a benchmark optical proximity correction of the design pattern to identify edge locations of an optical proximity correction; and training, by a hardware computer system, a machine learning model configured to predict optical proximity corrections for design patterns by evaluating the predicted optical proximity correction against the benchmark optical proximity correction based on data from the identified edge locations.

In an embodiment, the identified edge locations are identified edge pixels. In an embodiment, the identified edge locations are locations on a contour extracted for the optical proximity correction. In an embodiment, the data from the identified edge location on a contour is obtained by interpolation from data on a pixel grid of an image of the design pattern. In an embodiment, the method further comprises applying a different weighting to identified edge locations of the optical proximity correction than to other locations of the optical proximity correction. In an embodiment, the evaluating the predicted optical proximity correction against the benchmark optical proximity correction comprises determining edge placement error values between the identified edge locations for the predicted optical proximity correction and benchmark optical proximity correction and training the machine learning model based on the edge placement error values.

In an embodiment, there is provided a method comprising: obtaining a benchmark optical proximity correction image for a design pattern; generating, by a hardware computer system, a predicted optical proximity correction image for the design pattern using a machine learning model; identifying, by the hardware computer system, edge locations of features within the predicted and benchmark optical proximity correction images; evaluating, by the hardware computer system, data at identified edge locations of the benchmark optical proximity correction image against data at identified edge locations of the predicted optical proximity correction image; and adjusting, by the hardware computer system, a parameter of the machine learning model based on the evaluation.

In an embodiment, the identifying comprises tracing a contour to an edge of the features of the benchmark and predicted optical proximity correction images.

In an embodiment, there is provided a method comprising: obtaining a spatially shifted version of an input design pattern; and training, by a hardware computer system, a machine learning model configured to predict optical proximity corrections for design patterns using an objective function that has a penalty term, the penalty term involving a comparison between a value corresponding to a prediction made by the machine learning model with respect to the input design pattern and a value corresponding to an inversely shifted version of a prediction made by the machine learning model with respect to the shifted input design pattern, wherein the inverse shift is a spatial shift that is inverse to the spatial shift used to create the spatially shifted version of the input design pattern.

In an embodiment, the comparison comprises a distance function.

In an embodiment, the spatial shift involves operations including flipping and/or rotation.

Figure 19:
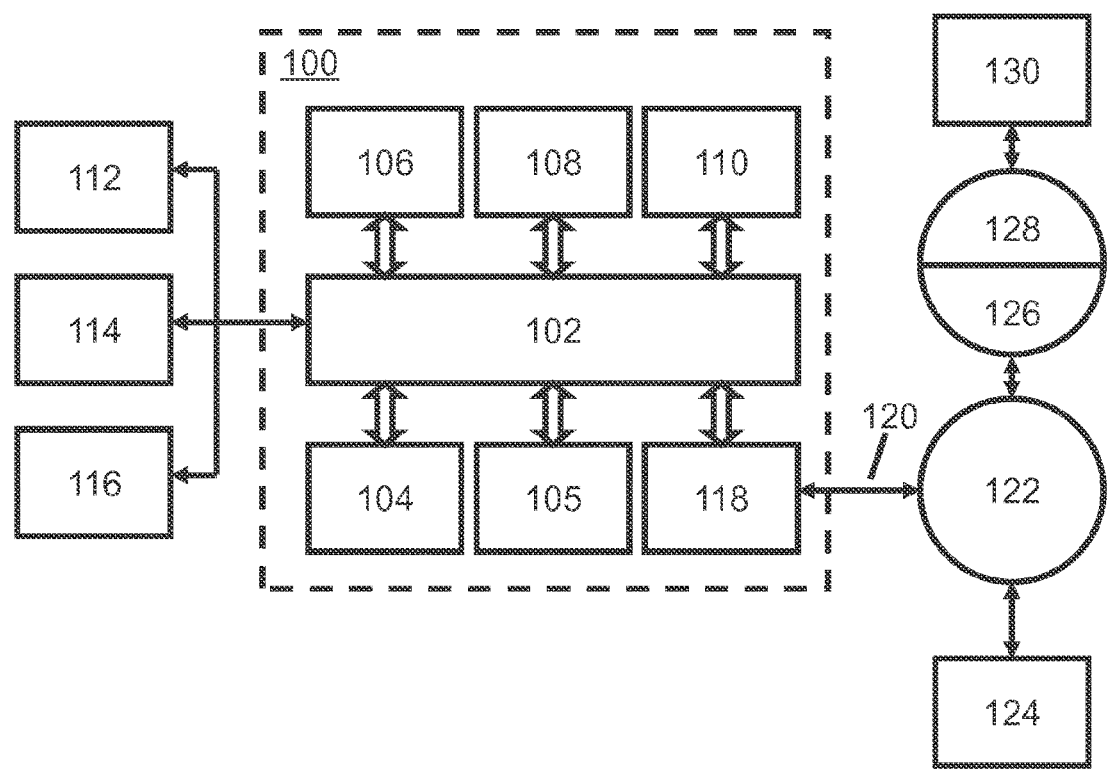
FIG. 19 is a block diagram of an example computer system according to an exemplary embodiment of the present disclosure.

FIG. 19 is a block diagram that illustrates a computer system 100 which can assist in implementing methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store or supply information and instructions to be executed by processor 104. Main memory 106 may be used to store or supply temporary variables or other intermediate information during execution of instructions to be executed by processor 104. Computer system 100 may further include a read only memory (ROM) 108 or other static storage device coupled to bus 102 to store or supply static information and instructions for processor 104. A storage device 110, such as a magnetic disk or optical disk, may be provided and coupled to bus 102 to store or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to an embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, or stored in storage device 110, or other non-volatile storage for later execution. In this manner, computer system 100 may obtain application code in the form of a carrier wave.

Figure 20:
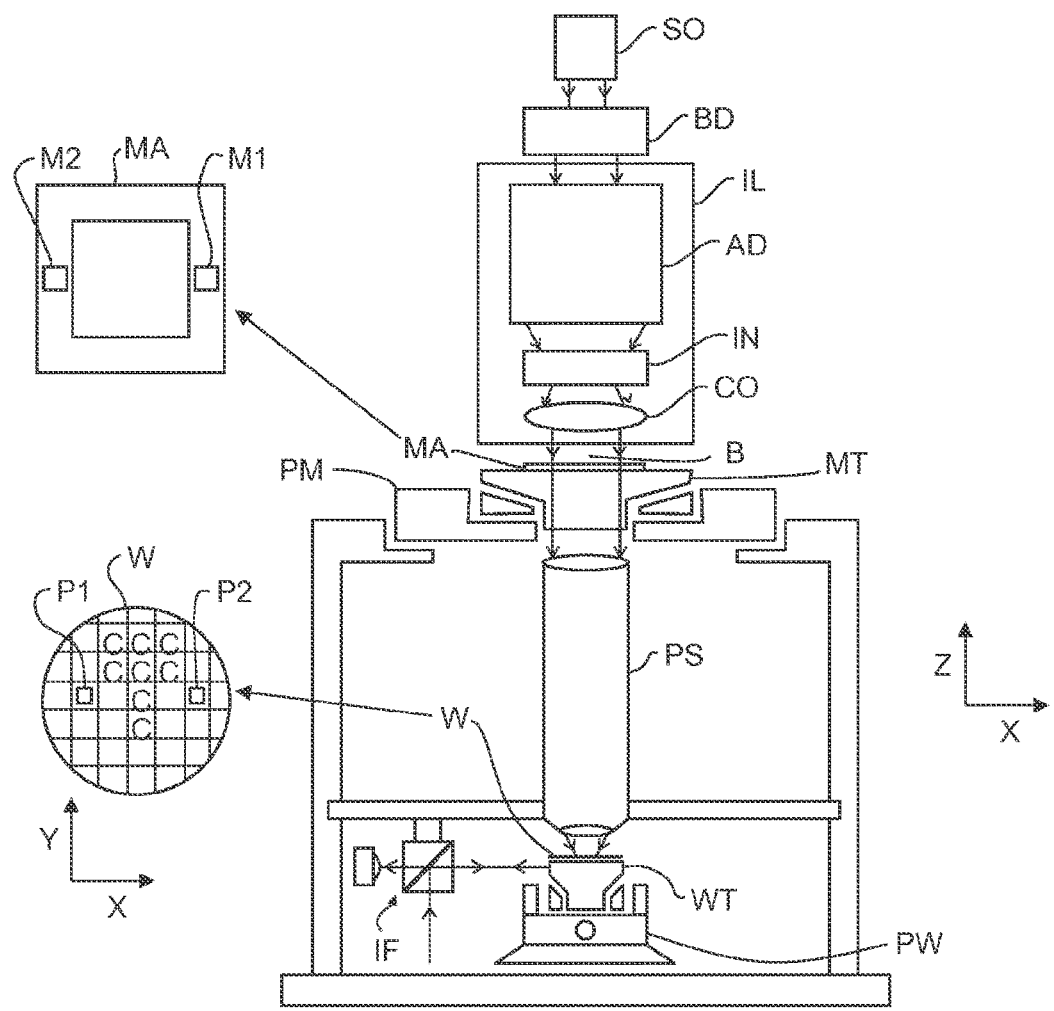
FIG. 20 is a schematic diagram of a lithographic projection apparatus according to an exemplary embodiment of the present disclosure.

FIG. 20 schematically depicts an exemplary lithographic projection apparatus. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner PM to accurately position the patterning device with respect to item PS;
- a second object table (substrate table) WT provided with a substrate holder to hold a substrate W (e.g., a resist-coated silicon wafer), and connected to a second positioner PW to accurately position the substrate with respect to item PS;
- a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer or inner radial extent (commonly referred to as a-outer and a-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 20 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 20.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 21:
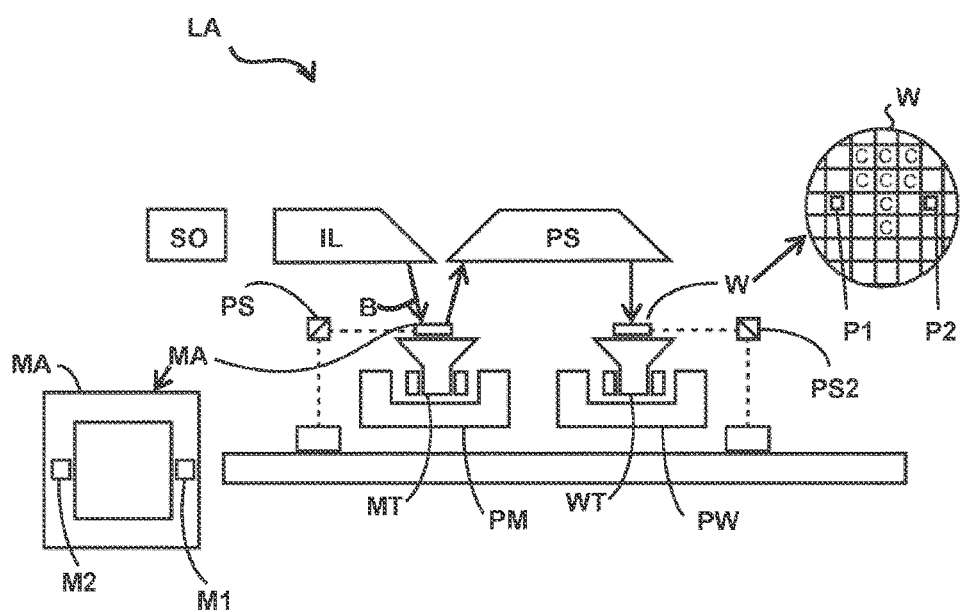
FIG. 21 is a schematic diagram of another lithographic projection apparatus according to an exemplary embodiment of the present disclosure.

FIG. 21 schematically depicts another exemplary lithographic projection apparatus 1000. The lithographic projection apparatus 1000 includes:

- a source collector module SO;
- an illumination system (illuminator) IL configured to condition a radiation beam B (e.g. EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multilayer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 21, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 21, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may comprise various other components, such as faceted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed.
2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, or a substrate table and a table without a substrate). In such "multiple stage" devices the additional tables may be used in parallel, or preparatory steps may be carried out on one or more tables while one or more other tables are being used for exposures.

Figure 22:
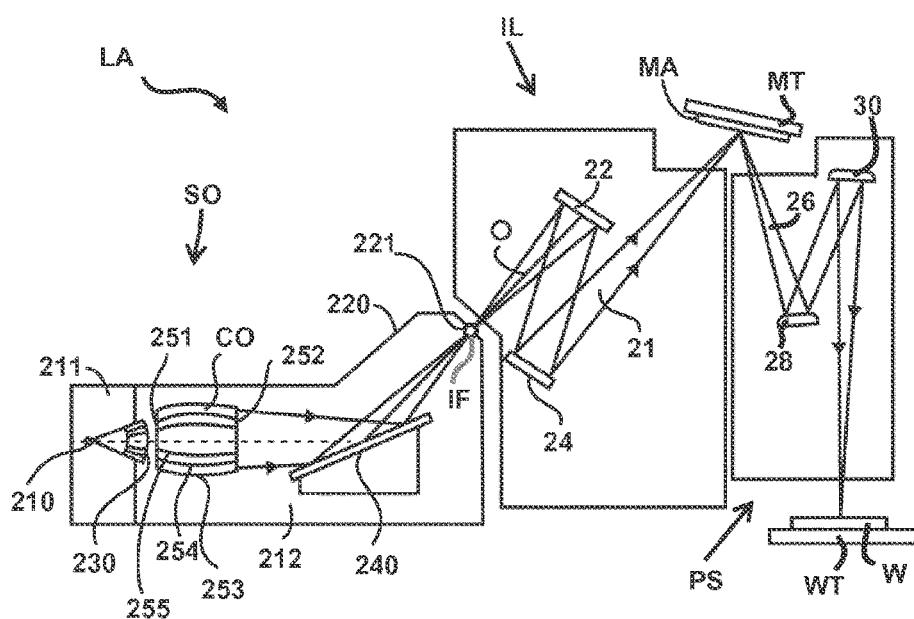
FIG. 22 is a more detailed view of the apparatus in FIG. 20 according to an exemplary embodiment of the present disclosure.

FIG. 22 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 22.

Collector optic CO, as illustrated in FIG. 22, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma source, often called a DPP source. Alternatively, the source collector module SO may be part of an LPP radiation system.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The embodiments may further be described using the following clauses:

1. A method comprising:
   obtaining training data set including an optical proximity correction corresponding to a spatially shifted version of a training design pattern; and
   training, by a hardware computer system, a machine learning model configured to predict optical proximity corrections for design patterns using data regarding the spatially shifted version of the training design pattern and data based on the optical proximity correction for the spatially shifted version of the training design pattern.

2. The method of clause 1, wherein the spatial shift is less than a size of a dimension of a pixel grid of an image of the training design pattern.

3. The method of clause 1 or clause 2, further comprising:
   obtaining the training data set including a plurality of differently spatially shifted versions of the training design pattern and corresponding optical proximity correction of differently spatially shifted versions of the training design pattern; and
   training the machine learning model using data regarding the plurality of differently spatially shifted versions of the training design pattern and the corresponding optical proximity correction of differently spatially shifted versions of the training design pattern.

4. The method of clause 3, further comprising:
   selecting at least one of the optical proximity correction out of the plurality of differently spatially shifted versions of optical proximity correction that exhibit a higher than average process window than the other remaining one or more versions of the optical proximity correction within the training data set; and
   training the machine learning model using data based on the selected one or more of the optical proximity corrections.

5. The method of clause 4, comprising selecting the optical proximity correction out of the plurality of differently spatially shifted versions of optical proximity correction that exhibits the best process window.

6. The method of clause 4 or clause 5, further comprising:
   performing one or more rotation, flipping, or both, operations on the selected optical proximity correction to obtain one or more re-oriented versions of the selected optical proximity correction; and
   training the machine learning model using data based on the one or more re-oriented versions of the selected optical proximity correction and corresponding one or more re-oriented training design patterns.

7. The method of any of clauses 4-6, further comprising:
   performing one or more spatial shifts of the selected optical proximity correction to obtain one or more differently spatially shifted versions of the selected optical proximity correction; and
   training the machine learning model using data based on the one or more differently spatially shifted versions of the selected optical proximity correction, and corresponding one or more differently spatially shifted versions of the training design pattern.

8. The method of any of clauses 1-7, wherein the obtaining and training is repeated for a plurality of different design patterns.
9. The method of any of clauses 1-8, wherein the optical proximity corrections comprise a placement of assist features around a main feature of a given design pattern and/or modification to the main feature of the given design pattern.
10. The method of any of clauses 1-9, wherein the optical proximity corrections are in the form of images and the training is based on the images or pixel data of the images.
11. The method of clause 10, wherein the images are
a gray-scale image rendered from a target design pattern image, and/or
a sub-resolution assist feature guidance map (SGM) map, and/or
a signal image obtained by convolving of an image of the target design pattern with an optical kernels, and/or
continuous transmission mask of an output image of a model-based mask optimization processing of the target design pattern.
12. A method comprising:
obtaining one or more spatially shifted versions of a design pattern and corresponding optical proximity correction image for each of the one or more shifted design patterns;
selecting, by a hardware computer system, one or more optical proximity correction images of the one or more shifted design patterns having a process window metric meeting or passing a threshold; and
training, by the hardware computer system, a machine learning model using training data comprising data regarding one or more spatially shifted versions of the design pattern and data regarding the selected one or more optical proximity correction images.
13. The method of clause 12, wherein further comprising:
reorienting the selected one or more optical proximity correction images to generated re-oriented one or more optical proximity correction images;
spatially shifting the re-oriented one or more optical proximity correction images to generate a plurality of differently shifted re-oriented one or more optical proximity correction images;
obtaining a plurality of differently shifted versions of the design pattern corresponding to the plurality of differently shifted re-oriented one or more optical proximity correction images; and training the machine learning model using training data comprising data regarding the plurality of differently shifted re-oriented one or more optical proximity correction images and data regarding the plurality of differently shifted versions of the design pattern.
14. The method of clause 13, wherein reorienting comprises one or more selected from: a flipping operation, a rotating operation, and/or a mirroring operation, wherein the type of operation is based on an illumination shape of a lithography apparatus.
15. The method of any of clauses 12-14, wherein the optical proximity correction image is a continuous transmission mask image.
16. A method comprising:
obtaining a weighting function or data to assign a different weight to a region of an optical proximity correction of a design pattern than another region thereof; and
training, by a hardware computer system, a machine learning model configured to predict optical proximity corrections for design patterns by evaluating a predicted optical proximity correction of the design pattern by the machine learning model against a benchmark optical proximity correction of the design pattern based on the weighting data.
17. The method of clause 16, wherein the weighting function or data is applied to the predicted optical proximity correction, the benchmark optical proximity correction, and/or a difference between predicted and benchmark optical proximity corrections.
18. The method of clause 16 or clause 17, wherein the weighting function or data assigns a higher weight to a region adjacent to a main feature of the design pattern than a region outside of that region.
19. The method of clause 18, wherein the region encompasses an optical proximity correction for the main feature but excludes another optical proximity correction for the main feature.
20. The method of any of clauses 16-19, wherein the weighting function or data assigns a higher weight to an edge of an optical proximity correction than an interior of the optical proximity correction and/or of another part of the design pattern.
21. The method of any of clauses 16-20, wherein the weighting function or data comprise a weighting function configured to decay the weight as a function of distance from a main feature of the design pattern.
22. A method comprising:
obtaining a benchmark optical proximity correction for a design pattern;
generating, by a hardware computer system, a predicted optical proximity correction for the design pattern using a machine learning model;
assigning, by the hardware computer system, a relatively high weight at a portion of the predicted and/or benchmark optical proximity correction; and
training, by the hardware computer system, the machine learning model using an objective function evaluating the weighted predicted and/or benchmark optical proximity corrections.
23. The method of clause 22, wherein the relatively high weight is assigned at an edge of the optical proximity correction.
24. The method of clause 22 or clause 23, wherein a different weight is assigned to a first optical proximity correction for a main feature of the design pattern than a second optical proximity correction for the main feature.
25. A method comprising:
applying, by a hardware computer system, a binarization function to image data of a predicted optical proximity correction of a design pattern by a machine learning model and/or a benchmark optical proximity correction of the design pattern to produce a respective binarized version thereof; and
training, by a hardware computer system, a machine learning model configured to predict optical proximity corrections for design patterns by evaluating the predicted optical proximity correction against the benchmark optical proximity correction based on the binarized version of the predicted and/or benchmark optical proximity correction.
26. The method of clause 25, wherein the binarization function is a sigmoid function.
27. A method comprising:
obtaining a benchmark optical proximity correction image for a design pattern;

generating, by a hardware computer system, a predicted optical proximity correction image for the design pattern using a machine learning model;

transforming, by the hardware computer system, the predicted and benchmark optical proximity correction images using a binarization function into respective binary images;

evaluating, by the hardware computer system, data of the binary image of benchmark optical proximity correction image against data of the binary image of the predicted optical proximity correction image; and adjusting, by the hardware computer system, a parameter of the machine learning model based on the evaluation.

28. The method of clause 27, wherein the binarization function is a sigmoid function.

29. A method comprising:

processing, by a hardware computer system, image data of a predicted optical proximity correction of a design pattern by a machine learning model and/or a benchmark optical proximity correction of the design pattern to identify edge locations of an optical proximity correction; and training, by a hardware computer system, a machine learning model configured to predict optical proximity corrections for design patterns by evaluating the predicted optical proximity correction against the benchmark optical proximity correction based on data from the identified edge locations.

30. The method of clause 29, wherein the identified edge locations are identified edge pixels.

31. The method of clause 29 or clause 20, wherein the identified edge locations are locations on a contour extracted for the optical proximity correction.

32. The method of clause 31, wherein the data from the identified edge location on a contour is obtained by interpolation from data on a pixel grid of an image of the optical proximity correction.

33. The method of any of clauses 29-32, further comprising applying a different weighting to identified edge locations of the optical proximity correction than to other locations of the optical proximity correction.

34. The method of any of clauses 29-33, wherein the evaluating the predicted optical proximity correction against the benchmark optical proximity correction comprises determining edge placement error values between the identified edge locations for the predicted optical proximity correction and benchmark optical proximity correction and training the machine learning model based on the edge placement error values.

35. A method comprising:

obtaining a benchmark optical proximity correction image for a design pattern; generating, by a hardware computer system, a predicted optical proximity correction image for the design pattern using a machine learning model;

identifying, by the hardware computer system, edge locations of features within the predicted and benchmark optical proximity correction images;

evaluating, by the hardware computer system, data at identified edge locations of the benchmark optical proximity correction image against data at identified edge locations of the predicted optical proximity correction image; and adjusting, by the hardware computer system, a parameter of the machine learning model based on the evaluation.

36. The method of clause 35, wherein the identifying comprises tracing a contour to an edge of the features of the benchmark and predicted optical proximity correction images.

37. A method comprising:

obtaining a spatially shifted version of an input design pattern; and training, by a hardware computer system, a machine learning model configured to predict optical proximity corrections for design patterns using an objective function that has a penalty term, the penalty term involving a comparison between a value corresponding to a prediction made by the machine learning model with respect to the input design pattern and a value corresponding to an inversely shifted version of a prediction made by the machine learning model with respect to the shifted input design pattern, wherein the inverse shift is a spatial shift that is inverse to the spatial shift used to create the spatially shifted version of the input design pattern.

38. The method of clause 37, wherein the comparison comprises a distance function.

39. The method of any of clauses 37-38, wherein the spatial shift involves operations including flipping and/or rotation.

40. A method comprising:

inputting a design pattern into a machine learning model trained according to any of clauses 1-39;

computing, by a hardware computer system and by the trained machine learning, a prediction of an optical proximity correction for the design pattern.

41. The method of any of clauses 1-40, wherein the machine learning model comprises a neural network made of instances of one or more fundamental blocks, wherein the one or more fundamental blocks comprise a convolution layer, a residual block and/or an inception block.

42. The method of clause 41, wherein the inception block consists of maximum one pooling layer with a stride of 1 and two or more convolutional layers with different filter size.

43. The method of clause 41 or clause 42, wherein the residual block has two convolutional layers and an additional path to directly connect the input and output of the residual block.

44. The method of any of clauses 41-43, wherein the neural network is made up of only instances of one or more selected from: the convolution layer, the residual block and/or the inception block.

45. The method of any of clauses 41-44, wherein the neural network essentially only involves convolution and pooling operations.

46. A computer program product comprising a computer readable medium having instructions recorded thereon, the instructions when executed by a computer implementing the method of any of clauses 1-45.

The concepts disclosed herein may be applicable to any device manufacturing process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic imaging systems, e.g., those used for imaging on substrates other than silicon wafers.

The patterning device referred to above comprises or can form a design layout. The design layout can be generated utilizing a CAD (computer-aided design) program. This process is often referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:
- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.
- a programmable LCD array.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

So, as noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein refers to or means adjusting a patterning process apparatus, one or more steps of a patterning process, etc. such that results and/or processes of patterning have more desirable characteristics, such as higher accuracy of transfer of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to cost constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures. For example, this technology may be structured for cloud computing whereby a single function is shared and processed in collaboration among a plurality of apparatuses via a network.

What is claimed is:

1. A method comprising:
   obtaining a benchmark optical proximity correction image for a design pattern;
   generating, by a hardware computer system, a predicted optical proximity correction image for the design pattern using a machine learning model;
   transforming, by the hardware computer system, the predicted and benchmark optical proximity correction images using a binarization function into respective binary images;
   evaluating, by the hardware computer system, data of the binary image of benchmark optical proximity correction image against data of the binary image of the predicted optical proximity correction image; and
   adjusting, by the hardware computer system, a parameter of the machine learning model based on the evaluation.

2. The method of claim 1, wherein the binarization function is a sigmoid function.

3. A computer program product comprising a non-transitory computer readable-medium having instructions stored therein, the instructions, when executed by a computer system, configured to cause the computer system to at least:
   obtain a benchmark optical proximity correction image for a design pattern;
   generate a predicted optical proximity correction image for the design pattern using a machine learning model;
   transform the predicted and benchmark optical proximity correction images using a binarization function into respective binary images;
   evaluate data of the binary image of benchmark optical proximity correction image against data of the binary image of the predicted optical proximity correction image; and adjust a parameter of the machine learning model based on the evaluation.

4. A method comprising:
processing image data of a predicted optical proximity correction of a design pattern by a machine learning model and/or of a benchmark optical proximity correction of the design pattern, to identify edge locations of an optical proximity correction; and
training, by a hardware computer system, the machine learning model configured to predict optical proximity corrections for design patterns by evaluating predicted optical proximity corrections against the benchmark optical proximity corrections based on data from the identified edge locations.

5. The method of claim 4, wherein the identified edge locations are identified edge pixels.

6. The method of claim 4, wherein the identified edge locations are locations on a contour extracted for the optical proximity correction.

7. The method of claim 6, wherein the data from the identified edge location on a contour is obtained by interpolation from data on a pixel grid of an image of the optical proximity correction.

8. The method of claim 4, further comprising applying a different weighting to identified edge locations of the optical proximity correction than to other locations of the optical proximity correction.

9. The method of claim 4, wherein the evaluating the predicted optical proximity correction against the benchmark optical proximity correction comprises determining edge placement error values between identified edge locations for the predicted optical proximity correction and benchmark optical proximity correction and training the machine learning model based on the edge placement error values.

10. A method comprising:
providing an input design pattern into a machine learning model trained according to claim 4;
computing, by a hardware computer system and by the trained machine learning model, a prediction of an optical proximity correction for the input design pattern.

11. A computer program product comprising a non-transitory computer readable-medium having instructions stored therein, the instructions, when executed by a computer system, configured to cause the computer system to at least:
process image data of a predicted optical proximity correction of a design pattern by a machine learning model and/or of a benchmark optical proximity correction of the design pattern, to identify edge locations of an optical proximity correction; and
train the machine learning model configured to predict optical proximity corrections for design patterns by evaluating predicted optical proximity corrections against benchmark optical proximity corrections based on data from the identified edge locations.

12. A method comprising:
obtaining a benchmark optical proximity correction image for a design pattern;
generating, by a hardware computer system, a predicted optical proximity correction image for the design pattern using a machine learning model;
identifying edge locations of features within the predicted and benchmark optical proximity correction images;
evaluating data at identified edge locations of the benchmark optical proximity correction image against data at identified edge locations of the predicted optical proximity correction image; and
adjusting a parameter of the machine learning model based on the evaluation.

13. The method of claim 12, wherein the identifying comprises tracing a contour to an edge of the features of the benchmark and predicted optical proximity correction images.

14. A method comprising:
providing an input design pattern into a machine learning model realized according to claim 12;
computing, by a hardware computer system and by the trained machine learning model, a prediction of an optical proximity correction for the input design pattern.

15. A computer program product comprising a non-transitory computer readable-medium having instructions stored therein, the instructions, when executed by a computer system, configured to cause the computer system to at least:
obtain a benchmark optical proximity correction image for a design pattern;
generate a predicted optical proximity correction image for the design pattern using a machine learning model;
identify edge locations of features within the predicted and benchmark optical proximity correction images;
evaluate data at identified edge locations of the benchmark optical proximity correction image against data at identified edge locations of the predicted optical proximity correction image; and
adjust a parameter of the machine learning model based on the evaluation.

16. A method comprising:
obtaining a spatially shifted version of an input design pattern; and
training, by a hardware computer system, a machine learning model configured to predict optical proximity corrections for design patterns using an objective function that has a penalty term, the penalty term involving a comparison between a value corresponding to a prediction made by the machine learning model with respect to the input design pattern and a value corresponding to an inversely shifted version of a prediction made by the machine learning model with respect to the shifted input design pattern, wherein the inverse shift is a spatial shift that is inverse to the spatial shift used to create the spatially shifted version of the input design pattern.

17. The method of claim 16, wherein the comparison comprises a distance function.

18. The method of claim 16, wherein the spatial shift involves operations including flipping and/or rotation.

19. A method comprising:
providing an input design pattern into a machine learning model trained according to claim 16;
computing, by a hardware computer system and by the trained machine learning model, a prediction of an optical proximity correction for the input design pattern.

20. A computer program product comprising a non-transitory computer readable-medium having instructions stored therein, the instructions, when executed by a computer system, configured to cause the computer system to at least:
obtain a spatially shifted version of an input design pattern; and train a machine learning model configured to predict optical proximity corrections for design patterns using an objective function that has a penalty term, the penalty term involving a comparison between a value corresponding to a prediction made by the machine learning model with respect to the input design pattern and a value corresponding to an inversely shifted version of a prediction made by the machine learning model with respect to the shifted input design pattern, wherein the inverse shift is a spatial shift that is inverse to the spatial shift used to create the spatially shifted version of the input design pattern.

\* \* \* \* \*

UNITED STATES PATENT AND TRADEMARK OFFICE
CERTIFICATE OF CORRECTION

PATENT NO. : 12,204,250 B2  
APPLICATION NO. : 18/233365  
DATED : January 21, 2025  
INVENTOR(S) : Jing Su et al.

Page 1 of 1

It is certified that error appears in the above-identified patent and that said Letters Patent is hereby corrected as shown below:

On the Title Page

Item (54) and in the Specification Column 1, Lines 1-3 Please correct "TRAINING METHODS FOR MACHINE LEARNING ASSISTED OPTICAL PROXIMITY ERROR" to read as "TRAINING METHODS FOR MACHINE LEARNING ASSISTED OPTICAL PROXIMITY ERROR CORRECTION"

Signed and Sealed this  
Twenty-fifth Day of February, 2025

Coke Morgan Stewart  
*Acting Director of the United States Patent and Trademark Office*